(12) United States Patent
Pinos

(10) Patent No.: US 12,300,763 B2
(45) Date of Patent: May 13, 2025

(54) LED PRECURSOR INCORPORATING STRAIN RELAXING STRUCTURE

(71) Applicant: PLESSEY SEMICONDUCTORS LIMITED, Plymouth (GB)

(72) Inventor: Andrea Pinos, Plymouth (GB)

(73) Assignee: Plessey Semiconductors Limited, Plymouth (GB)

( * ) Notice: Subject to any disclaimer, the term of this patent is extended or adjusted under 35 U.S.C. 154(b) by 470 days.

(21) Appl. No.: 17/635,822

(22) PCT Filed: Sep. 1, 2020

(86) PCT No.: PCT/EP2020/074302
§ 371 (c)(1),
(2) Date: Feb. 16, 2022

(87) PCT Pub. No.: WO2021/043748
PCT Pub. Date: Mar. 11, 2021

(65) Prior Publication Data
US 2022/0302344 A1 Sep. 22, 2022

(30) Foreign Application Priority Data
Sep. 6, 2019 (GB) .................................... 1912858

(51) Int. Cl.
*H01L 33/12* (2010.01)
*H01L 33/00* (2010.01)
(Continued)

(52) U.S. Cl.
CPC ............ *H01L 33/12* (2013.01); *H01L 33/007* (2013.01); *H01L 33/20* (2013.01); *H01L 25/167* (2013.01); *H01L 33/0093* (2020.05)

(58) Field of Classification Search
CPC ............. H01L 25/167; H01L 27/14601; H01L 27/14632; H01L 27/14634; H01L 27/15;
(Continued)

(56) References Cited

U.S. PATENT DOCUMENTS

| 6,233,267 B1 | 5/2001 | Nurmikko et al. |
| 2003/0205711 A1 | 11/2003 | Tanizawa et al. |

(Continued)

FOREIGN PATENT DOCUMENTS

| JP | 2002185084 A | 6/2002 |
| WO | 2019154878 A1 | 8/2019 |

OTHER PUBLICATIONS

International Search Report and Written Opinion, PCT/EP2020/074302, dated Nov. 16, 2020, 12 pages.
(Continued)

*Primary Examiner* — Cheung Lee
(74) *Attorney, Agent, or Firm* — Stinson LLP

(57) ABSTRACT

A Light Emitting Diode (LED) precursor comprising a first semiconducting layer, and a monolithic LED structure provided on a growth surface of the first semiconducting layer is provided. The first semiconducting layer includes a mesa structure extending from a major surface of the first semiconducting layer. The first semiconducting layer comprises a first semiconducting sublayer having a first in-plane lattice constant, and a strain-relaxed sublayer. The strain relaxed sublayer comprises a Group III-nitride provided across the first semiconducting sublayer, wherein the strain relaxed sublayer provides the mesa surface of the mesa structure, such that the mesa surface has a second in-plane lattice constant which is larger than the first in-plane lattice constant. The monolithic LED structure is provided such that the monolithic LED structure covers the mesa surface.

14 Claims, 6 Drawing Sheets

(51) Int. Cl.
*H01L 33/20* (2010.01)
*H01L 25/16* (2023.01)

(58) Field of Classification Search
CPC . H01L 27/156; H01L 33/007; H01L 33/0075; H01L 33/0093; H01L 33/06; H01L 33/12; H01L 33/20; H01L 2933/0008
See application file for complete search history.

(56) References Cited

U.S. PATENT DOCUMENTS

| | | |
|---|---|---|
| 2009/0072253 A1 | 3/2009 | Karino et al. |
| 2009/0140274 A1 | 6/2009 | Wierer, Jr. et al. |
| 2010/0032793 A1 | 2/2010 | Guenard et al. |
| 2010/0072489 A1 | 3/2010 | McLaurin et al. |
| 2011/0177631 A1 | 7/2011 | Gardner et al. |
| 2011/0284890 A1 | 11/2011 | Kim et al. |
| 2011/0284993 A1 | 11/2011 | Kim |
| 2011/0294245 A1 | 12/2011 | Guenard et al. |
| 2012/0313076 A1 | 12/2012 | Nakamura et al. |
| 2013/0214251 A1 | 8/2013 | Balkenende et al. |
| 2014/0014966 A1 | 1/2014 | Tabatabaie et al. |
| 2014/0131730 A1 | 5/2014 | Keller et al. |
| 2014/0191261 A1* | 7/2014 | Shatalov ............... H01L 33/007 438/47 |
| 2017/0040518 A1 | 2/2017 | Guenard |
| 2017/0098731 A1 | 4/2017 | Shatalov et al. |
| 2017/0345969 A1 | 11/2017 | Romano et al. |
| 2020/0013921 A1 | 1/2020 | Sotta |
| 2021/0242086 A1 | 8/2021 | Gandrothula et al. |
| 2021/0265418 A1 | 8/2021 | Pinos et al. |

OTHER PUBLICATIONS

Taiwanese Search Report, Application No. 109129992, dated Jun. 23, 2021, 13 pages.

Great Britain Search Report, Application No. GB1912858.6, dated Feb. 27, 2020, 5 pages.

* cited by examiner

LED PRECURSOR INCORPORATING STRAIN RELAXING STRUCTURE

REFERENCE TO RELATED APPLICATIONS

This application is the 371 U.S. national stage application of International Patent Application No. PCT/EP2020/074302, filed Sep. 1, 2020, which claims the benefit of Great Britain Patent Application No. 1912858.6, filed Sep. 6, 2019, the entire disclosures of which are incorporated herein by reference.

FIELD OF THE DISCLOSURE

The present disclosure relates to Group III-nitride semiconductors. In particular, the present disclosure relates to Light Emitting Diodes (LEDs) comprising Group III-nitride semiconductors.

BACKGROUND

Micro LED arrays are commonly defined as arrays of LEDs with a size of 100×100 μm2 or less. Micro LED arrays are a self-emitting micro-display/projector which are suitable for use in a variety of devices such as smartwatches, head-wearing displays, head-up displays, camcorders, viewfinders, multisite excitation sources, and pico-projectors.

In many applications it is desirable to provide a micro-display/projector capable of outputting light having a range of wavelengths. For example, in many colour displays it is common to provide each pixel with the ability to output a combination of red, green, and blue light.

One known form of a micro-LED array comprises a plurality of LEDs formed from Group III-nitrides. Group III-nitride LEDs are inorganic semiconductor LEDs containing GaN and its alloys with InN and AlN in the active light-emitting region. Group III-nitride LEDs can be driven at significantly higher current density and emit a higher optical power density than conventional large-area LEDs, for example organic light emitting diodes (OLED) in which the light-emitting layer is an organic compound. As a result, higher luminance (brightness), defined as the amount of light emitted per unit area of the light source in a given direction, makes micro LEDs suitable for applications requiring or benefiting from high brightness. For example, applications which benefit from high brightness may include displays in high brightness environments or projectors. Additionally, Group III-nitride micro LEDs are known to have relatively high luminous efficacy, expressed in lumens per watt (lm/W) compared to other conventional large area LEDs. The relatively high luminous efficacy of III-nitride micro LED arrays reduces power usage compared with other light sources and makes micro LEDs particularly suitable for portable devices.

One method for forming micro LEDs, in particular, micro LED arrays, from Group III-nitrides is selective area growth (SAG), such as described in U.S. Pat. No. 7,087,932. In the SAG technique, a mask is patterned on a buffer layer. The material in the mask is such that the at the growth conditions, no additional material is grown directly on the mask but only inside apertures exposing portions of the surface of the underlying buffer layer. Another noteworthy feature of selective area growth of Group III-nitrides grown along the [0001] direction is that depending on the growth parameters such as growth temperature, pressure, and V/III ratio, inclined facets with respect to the (0001) plane also known as c-plane are obtained around the perimeter of the growing portions of c-plane semiconductor as defined by the open areas of the patterned mask. The inclined facets are generally oriented along the $\{1\bar{1}\,0\,1\}$ or $\{1\bar{1}\,0\,2\}$ planes of the wurtzite crystal and present reduced polarisation fields compared with c-plane surfaces (semi-polar surfaces).

One known type of Group III nitride LEDs utilise the In—Ga—N alloy system to define multiple quantum wells in an active region of an LED. Typically, alternating layers of GaN and $In_xGa_{1-x}N$ are provided to define the quantum wells. For blue LEDs, the Indium mole fraction, X is typically <0.2. Increasing the amount of Indium incorporated into the $In_xGa_{1-x}N$ layers increases the depth of the potential well, thereby increasing the wavelength of the light emitted by the LED.

However, it is known that increasing the Indium mole fraction X above 0.2, for example, to provide native green and red LEDs significantly reduces the efficiency of the LED. One of the fundamental issues is the low incorporation efficiency of Indium if deposited on relaxed or compressively strained GaN. High In fraction layers generally require the use of low growth temperature and are prone to phase segregation with detrimental effects on the IQE (for example JOURNAL OF APPLIED PHYSICS 123, 160901 (2018)).

"InGaN lattice constant engineering via growth on (In, Ga)N/GaN nanostripe arrays", Keller S. et al., Semicond. Sci. Technol., vol. 30, (2015), discloses planar (In, Ga)N layers grown on nanostripe arrays composed of InGaN/GaN multiple quantum wells. The nanostripe arrays exhibited elastic relaxation perpendicular to the stripe direction after pattern fabrication, resulting in an a⊥ lattice constant perpendicular to the stripe direction larger than that of the GaN base layer.

U.S. Pat. No. 8,492,244 discloses a method of forming islands of a strain relaxed material layer on an intermediate substrate, at least partially relaxing the strained material islands by a first heat treatment, and transferring the at least partially strained material islands to the target substrate.

It is an object of the present invention to provide an improved method for forming an LED precursor, as well as improved LED precursors which tackle at least one of the problems associated with prior art methods and arrays, or at least, provide a commercially useful alternative thereto.

SUMMARY OF THE DISCLOSURE

The present inventors have realised that SAG methods are highly dependent on the geometry of the layers/devices to be fabricated. As such, performing the same SAG fabrication processes on substrates with different mask geometries may result in undesirable local variations in doping profiles and layer compositions resulting from local variations in aperture size. Furthermore, there may also be variations in doping profiles and layer compositions over different substrates due to differences in layout. That is to say, the doping profiles/alloy composition for each layer of an LED device formed by SAG may be dependent on the geometry of the device. Consequently, small changes in geometry of a device, or an array of devices, may require the SAG process for each layer of the device to be calibrated again.

Furthermore, the present inventors have realised that during a SAG process, material from the mask layer may be incorporated into the deposited structure. For example, elements within the masking layer may diffuse into the material grown by SAG during fabrication, resulting in undesirable doping of the LED structures grown. In particular, masking layers including Si or O (e.g. SiNx, SiO2) may provide a source of Si or O dopants for Group III-nitride layers grown by SAG.

According to a first aspect of the disclosure, a method of forming a light emitting diode (LED) precursor is provided. The method comprises:

(a) forming a first semiconducting layer on a substrate, forming the first semiconducting layer comprising:
    forming a first semiconducting sublayer comprising a Group III-nitride having a first in-plane lattice constant on a surface of the substrate; and
    forming a strained sublayer comprising a Group III-nitride on the first semiconducting sublayer on an opposite side of the first semiconducting sublayer to the substrate, wherein the strained sublayer at the interface between the strained sublayer and the first semiconducting sublayer is under compressive strain such that an in-plane lattice constant of the strained sublayer at the interface is the first in-plane lattice constant;
(b) selectively removing a portion of the first semiconducting layer to expose a bulk semiconducting layer surface of the first semiconducting layer such that the first semiconductor layer defines a mesa structure extending from the bulk semiconducting layer surface;
(c) heating the strained sublayer to a strain relaxing temperature, wherein the strained sublayer relaxes through plastic deformation to form a strain relaxed sublayer, wherein the mesa structure has a mesa surface formed from a portion of the strain relaxed sublayer having a second in-plane lattice constant which is larger than the first in-plane lattice constant;
(d) forming a monolithic LED structure on the first semiconducting layer such that the monolithic LED structure covers the mesa surface and the bulk semiconducting surface, the monolithic LED structure comprising a plurality of Group III-nitride layers, the monolithic LED structure having:
    a first monolithic LED structure portion provided over the mesa surface; and
    a second monolithic LED structure portion encircling the first monolithic LED structure portion and having an inclined sidewall surface relative to the mesa surface.

In SAG methods, a monolithic LED structure can be grown on an exposed portion of a buffer layer. The monolithic LED structure is not grown on portions of the buffer layer covered by the mask layer. In the method of the first aspect, the monolithic LED structure is overgrown on the growth surface of the first semiconducting layer, without the presence of a mask layer. As such, the method of fabricating the monolithic LED structure is a mask-less overgrowth method.

The method of the first aspect allows a monolithic LED structure to be formed on a growth surface without the presence of a mask layer. Thus, the method of the first aspect reduces or eliminates problems associated with material recycling and mask layer contamination.

The mesa structure forming part of the growth surface helps to define the geometry of monolithic LED structure. Thus, in contrast to known SAG methods, no mask layer is needed to define apertures for selective growth of a monolithic LED structure. Rather, the monolithic LED structure is grown over the growth surface to cover the mesa structure. By covering the mesa structure, the monolithic LED structure formed has a first, substantially planar portion, covering the mesa surface, and a second portion encircling the mesa surface having inclined sidewalls similar to monolithic LED structures grown by SAG methods known in the art.

Importantly, the mesa surface is formed from a portion of the strain relaxed surface of the strain relaxed sublayer. By incorporating a strain relaxed sublayer into the first semiconducting layer, the mesa surface may be configured for the growth of monolithic LED structures having higher In-content active layers. That is to say, the in-plane lattice constant of the mesa surface may be provided to such that a lattice mismatch between the mesa surface and the monolithic LED structure is reduced.

Furthermore, the method of the first aspect involves the formation of the layers of the monolithic LED structure across the growth surface, including the mesa surface and the bulk semiconducting surface. The layers of the monolithic LED structure may by formed using fabrication processes similar to SAG. However, in the method of the first aspect the layers of the monolithic LED structure are formed across the whole growth surface (i.e. no mask layer present). Thus, the formation of the layers of the monolithic LED structure are less sensitive to variations in the geometry of the LED precursor to be formed. Consequently, the method of forming an LED precursor may reduce or eliminate calibration processes which may need to be performed for forming the layers of the monolithic LED precursor each time the geometry of the device is changed.

It will be appreciated that the method of the first aspect results in a monolithic LED structure having a substantially planar, upper surface surrounded by inclined sidewalls. As such, the monolithic LED structure may have a substantially trapezoidal cross section. Such trapezoidal cross sections may have increased light extraction efficiency, as the inclined sidewalls of the trapezoidal cross section may direct a greater proportion of light towards a light emitting surface of the LED precursors.

Furthermore, the method of the first aspect involves the formation of the layers of the monolithic LED structure across the mesa surface and the bulk semiconducting layer surface. The layers of the monolithic LED structure may by formed using fabrication processes similar to SAG. However, in the method of the first aspect the layers of the monolithic LED structure are formed across the whole growth surface (i.e. no mask layer present). Thus, the formation of the layers of the monolithic LED structure are less sensitive to variations in the geometry of the LED precursor to be formed. Consequently, the method of forming an LED precursor may reduce or eliminate the calibration processes to be performed for forming the layers of the monolithic LED precursor each time the geometry of the device is changed.

In particular, in the method of the first aspect the geometry of the LED precursor may be influenced by the geometry of the mesa structure formed. For example, when forming LED precursors with trapezoidal cross sections, the height and surface area of the mesa structure may be varied in order to control a desired height and surface are of the LED precursor formed. As such, an aspect ratio of the LED precursor formed may be tuned using the selective removal step. The subsequent steps in which the monolithic LED structure is deposited over the mesa structure may be kept constant, regardless of LED precursor aspect ratio. By contrast, in a SAG process, changes to the aspect ratio of a trapezoidal cross section the LED structure may require one or more of the deposition steps to be recalibrated.

By the term "precursor" in LED precursor, it is noted that the LED precursor described does not necessarily include the electrical contacts for the LED such as to allow the emission of light, nor the associated circuitry. Of course, the method of forming the LED precursor of the first aspect does not preclude the addition of further electrical contacts and associated circuitry. As such use of the term precursor in this disclosure is intended to include the finalised product (i.e. a LED, a LED array etc.).

In some embodiments, the step of selectively removing a portion of the first semiconducting layer includes removing a portion of the strained sublayer through a thickness of the strained sublayer and a corresponding portion of the first semiconducting sublayer, such that the bulk semiconducting layer surface is formed in the first semiconducting sublayer. In some embodiments, the step of selectively removing a portion of the first semiconducting layer includes removing a portion of the strained sublayer partially through its thickness (i.e. not removing a portion of the first semiconducting sublayer). Thus, it will be appreciated that the bulk semiconducting layer surface may be provided by the strained sublayer in some embodiments, and by the first semiconductor sublayer in other embodiments.

The strained sublayer may be provided in a number of different forms in order to form the strain relaxed surface having the desired in-plane lattice constant. The strained sublayer may be configured to provide an interface between the first semiconducting sublayer having the first in plane lattice constant and the monolithic LED structure (in particular an active region of the monolithic LED structure) which has a higher in-plane lattice constant. In some embodiments, the strained sublayer comprises $In_XGa_{1-X}N$, where $0<X\leq1$. For example, in some embodiments the first semiconducting sublayer comprises GaN having a first in-plane lattice constant, and the strained sublayer comprises $In_XGa_{1-X}N$, wherein the increased In content of the strained sublayer increases the in-plane lattice constant relative to the GaN layer.

In some embodiments, the strained sublayer is provided as a single layer of uniform composition (e.g. a single $In_XGa_{1-X}N$ layer). That is to say, the composition of the $In_XGa_{1-X}N$ sublayer is substantially the same throughout the sublayer.

In some embodiments, the strained sublayer comprises a plurality of layers, alternating between a first strain layer comprising GaN and a second strain layer comprising $In_XGa_{1-X}N$, where $0<X\leq1$.

In some embodiments, the In content (X) of the strained sublayer changes (e.g. increases or decreases) in the thickness direction. For example, in some embodiments, the In content (X) of the strained sublayer changes in the thickness directions decreases in the thickness direction away from the first semiconducting sublayer. For example, in some embodiments, the strained sublayer may be single layer of $In_XGa_{1-X}N$, wherein the composition (i.e. the In content X) is graded in the thickness direction. In some embodiments, where the strained sublayer comprises a plurality of layers, alternating between a first strain layer comprising and a second strain layer the In content of each of the second strain layer may be different (i.e. decreasing in the thickness direction away from the first semiconducting sublayer). By providing the strained sublayer with a higher In content towards the first semiconducting layer, the formation of misfit dislocations when forming the strain relaxed sublayer may be promoted in a region away from the strain relaxed surface. That is to say, the greatest lattice mismatch is provided away from the growth surface of the first semiconductor layer, thereby reducing the influence of lattice mismatch (dislocations) on the electrical properties of the LED precursor.

In some embodiments, the monolithic LED structure comprises a second semiconducting layer provided over the mesa surface and the bulk semiconducting layer surface of the first semiconducting layer. In some embodiments, the monolithic LED structure comprises an active layer comprising a plurality of Group III nitride layers provided on the second semiconducting layer. In some embodiments, the monolithic LED structure comprises a p-type semiconducting layer comprising a Group III nitride formed on the active layer.

Importantly, each of the monolithic LED structure layers may be formed as a substantially continuous layer over growth surface of the first semiconducting layer.

In some embodiments, the second semiconducting layer comprises GaN. In some embodiments, the second semiconducting layer comprises $In_YGa_{1-Y}N$, where $0<Y\leq1$. For example, in some embodiments the second semiconducting layer comprises $In_YGa_{1-Y}N$, where $0<Y\leq0.15$. In some embodiments, the second semiconducting layer may comprise an n-type dopant (i.e. the second semiconducting layer may be n-type doped).

In some embodiments, the active layer may be configured to output light having a wavelength of at least 500 nm. That is to say, the LED precursor may be configured to generate visible light having a wavelength which is substantially green light, or red light.

In some embodiments, the active layer comprises at least one quantum well layer comprising $In_ZGa_{1-Z}N$, where $0<Z\leq0.5$. The In content of the quantum well layer (Z), and/or the thickness of the at least one quantum well layer may be configured to provide the desired wavelength of the light output by the LED. In some embodiments, the active layer comprises a plurality of quantum well layers, each layer separated by a layer of GaN. In particular, in some embodiments, the quantum well layer comprises $In_ZGa_{1-Z}N$, where $0.2\leq Z\leq0.5$.

In some embodiments, the quantum well layer may have a third in-plane lattice constant which is at least equal to the second in-plane lattice constant. As such, the strain relaxed surface provides an intermediate surface for on which the second semiconducting layer and the active region can be formed with reduced lattice mismatch.

In some embodiments, a potential barrier is provided between a first portion of the p-type semiconducting layer covering the mesa surface and a second portion of the p-type semiconducting layer covering the bulk semiconducting surface, the potential barrier surrounding the first portion of the p-type semiconducting layer covering the mesa surface It will be appreciated that unlike SAG techniques, the monolithic LED structure is grown across the growth surface, including across the bulk semiconducting layer surface. To confine charge carriers within the portion of the monolithic LED structure defined by the mesa structure, a potential barrier is provided in the p-type layer of the monolithic LED structure. The p-type layer is provided between the first portion of the p-type semiconducting layer covering the mesa surface and a second portion of the p-type semiconducting layer covering the bulk semiconducting surface in order to confine charge carriers that flow through the first portion of the p-type layer (i.e. confine charge carriers within the mesa structure).

In some embodiments, the step of forming a strain relaxed sublayer includes a heat treatment step in which the strained sublayer is heated (from room temperature) to a temperature of at least 800° C. By heating the strained sublayer dislocations may propagate through the strained sublayer as the strained sublayer relaxes. This in turn reduces the strain in the strain relaxed surface above, thereby increasing the in plane lattice constant of the strain relaxed surface. As such, a heat treatment step may be used to control (increase) a lattice constant of the strain relaxed surface.

According to a second aspect of the disclosure, a Light Emitting Diode (LED) precursor is provided. The LED precursor comprises a first semiconducting layer, and a monolithic LED structure. The first semiconducting layer includes a mesa structure extending from a major surface of the first semiconducting layer to define a growth surface including a bulk semiconductor surface and a mesa surface. The first semiconducting layer comprises a first semiconducting sublayer and a strain relaxed sublayer. The first semiconducting sublayer comprises a Group III-nitride having a first in-plane lattice constant. The strain relaxed sublayer comprises a Group III-nitride provided across the first semiconducting sublayer, wherein the strain relaxed sublayer provides the mesa surface of the mesa structure, the mesa surface having a second in-plane lattice constant which is larger than the first in-plane lattice constant. The monolithic LED structure is provided on the growth surface of the first semiconducting layer such that the monolithic LED structure covers the mesa surface and the bulk semiconducting surface. The monolithic LED structure comprises a plurality of Group III-nitride layers. The monolithic LED structure has a first monolithic LED structure portion provided over the mesa surface, and a second monolithic LED structure portion encircling the first monolithic LED structure portion and having an inclined sidewall surface relative to the mesa surface.

The LED precursor according to the second aspect provides an LED precursor which may be formed by the method of the first aspect. Accordingly, the LED precursor according to the second aspect may incorporate features corresponding to all of the important features of the first aspect described above.

In some embodiments, the LED precursor comprises a substrate on which the first semiconducting layer is provided. In some embodiments, the first semiconducting layer is not provided on a substrate. For example, a substrate may have been removed from the first semiconducting layer to expose a surface of the first semiconducting layer on an opposite side of the first semiconducting layer to the monolithic LED structure.

According to a third aspect of the disclosure a method of forming a LED array precursor is provided. The method comprises:
(a) forming a first semiconducting layer on a substrate, forming the first semiconducting layer comprising:
forming a first semiconducting sublayer comprising a Group III-nitride having
a first in-plane lattice constant on a surface of the substrate; and forming a strained sublayer comprising a Group III-nitride on the first semiconducting sublayer on an opposite side of the first semiconducting sublayer to the substrate, wherein the strained sublayer at the interface between the strained sublayer and the first semiconducting sublayer is under compressive strain such that an in-plane lattice constant of the strained sublayer at the interface is the first in-plane lattice constant; (b) selectively removing a portion of the first semiconducting layer to expose a bulk semiconducting layer surface of the first semiconducting layer such that the first semiconductor layer defines a plurality of mesa structures each extending from the bulk semiconducting layer surface, (c) heating the strained sublayer to a strain relaxing temperature, wherein the strained sublayer relaxes through plastic deformation to form a strain relaxed sublayer wherein each mesa structure has a mesa surface formed from a portion of the strain relaxed sublayer having a second in-plane lattice constant which is larger than the first in-plane lattice constant;
(d) forming a monolithic LED structure on the first semiconducting layer such that the monolithic LED structure covers the mesa surfaces and the bulk semiconducting surface, the monolithic LED structure comprising a plurality of Group III-nitride layers, the monolithic LED structure having:
a plurality of first monolithic LED structure portions, each first monolithic LED structure portion provided over a respective mesa surface; and
a plurality of second monolithic LED structure portions, each second monolithic LED structure portion encircling a first monolithic LED structure portion and having an inclined sidewall surface relative to the respective mesa surface.

The method according to the third aspect of the disclosure provides a method of forming a plurality of monolithic LED structures on a substrate, wherein each of the monolithic LED structures formed is similar to those formed by the method of the first aspect of the disclosure. Accordingly, the method according to the third aspect may include all the important features as described above in relation to the first aspect.

According to a fourth aspect of the disclosure, a LED array precursor is provided. The LED array precursor comprises a first semiconducting layer and a monolithic LED array structure. The first semiconducting layer includes a plurality of mesa structures. Each mesa structure extends from a major surface of the first semiconducting layer to define a growth surface including a bulk semiconductor surface and a plurality of mesa surfaces. The first semiconducting layer comprises a first semiconducting sublayer, and a strain relaxed sublayer. The first semiconducting sublayer comprises a Group III-nitride having a first in-plane lattice constant. The strain relaxed sublayer comprises a Group III-nitride provided across the first semiconducting sublayer, wherein the strain relaxed sublayer provides the mesa surface of each mesa structure, the mesa surface having a second in-plane lattice constant which is larger than the first in-plane lattice constant. Each mesa structure has a mesa surface formed from a respective portion of the strain relaxed surface. The monolithic LED structure is provided on the growth surface of the first semiconducting layer such that the monolithic LED structure covers each mesa surface and the bulk semiconducting surface. The monolithic LED structure comprises a plurality of Group III-nitride layers. The monolithic LED structure has a plurality of first monolithic LED structure portions, each first monolithic LED structure portion provided over a respective mesa surface, and a plurality of second monolithic LED structure portions, each second monolithic LED structure portion encircling a first monolithic LED structure portion and having an inclined sidewall surface relative to the respective mesa surface.

The LED precursor, the LED array precursor, and the methods of forming thereof according to the first through fourth aspects of the disclosure may, in some embodiments provide micro LED precursors and micro LED array precursors. A micro LED array precursor is an array of micro LED precursors. The micro LED precursor may each have dimensions of less than 100 µm×100 µm. That is to say, at least the mesa portions of each micro LED have a mesa surface which has dimensions of less than 100 µm×100 µm. For example, in some embodiments, a mesa surface of a micro LED precursor has a surface area of less than $10^{-8}$ m$^2$.

BRIEF DESCRIPTION OF THE FIGURES

The disclosure will now be described in relation to the following non-limiting figures. Further advantages of the disclosure are apparent by reference to the detailed description when considered in conjunction with the figures in which.

DETAILED DESCRIPTION

According to an embodiment of this disclosure, a method of forming a LED precursor 1 is provided. The method of forming the LED precursor will now be described with reference to FIGS. 1-4.

This description refers to lattice constants of layers of a LED precursor 1. Unless otherwise explicitly stated, reference to a lattice constant of a layer is to be understood to refer to the in-plane lattice constant of the layer, rather than a lattice constant of representing a dimension normal to the layer (an out-of-plane lattice constant).

Figure 1:
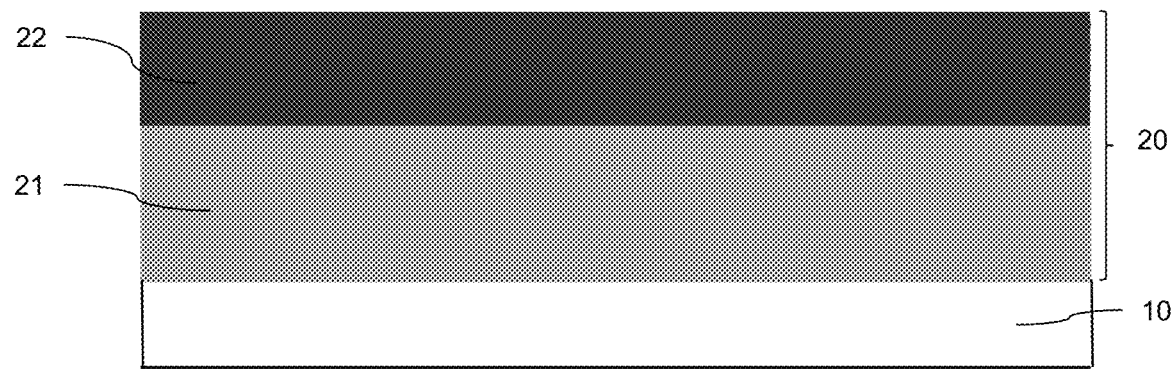
FIG. 1 shows a diagram of an intermediate step of a method according to an embodiment of the disclosure in which a first semiconducting layer comprising a first semiconducting sublayer and a strained sublayer is provided.

As shown in FIG. 1, a substrate 10 may be provided for forming the LED precursor thereon. The substrate may be any substrate 10 suitable for the formation of Group III-nitride electronic devices. For example, the substrate 10 may be a sapphire substrate, or a silicon substrate. The substrate may comprise one or more buffer layers configured to provide a substrate surface suitable for the formation of Group III-nitride layers.

A first semiconducting layer 20 is formed on the substrate surface. The first semiconducting layer 20 comprises a plurality of layers. As shown in FIG. 1, the first semiconducting layer 20 comprises a first semiconducting sublayer 21 and a strained sublayer 22.

The first semiconducting sublayer 21 comprises a Group III-nitride. In some embodiments, the first semiconducting sublayer may be n-type doped. In other embodiments, the semiconducting layer may not be intentionally doped. For example, in the embodiment of FIG. 1, the first semiconducting sublayer 21 comprises GaN. The GaN may be n-typed doped using a suitable dopant, for example Si, or Ge. The first semiconducting sublayer 21 may be deposited using any suitable process for the fabrication of Group III-nitride thin films, for example, Metal Organic Chemical Vapour Deposition (MOCVD), or Molecular Beam Epitaxy (MBE). The first semiconducting sublayer 21 has a first surface which is a surface of the first semiconducting sublayer 21 on an opposite side of the first semiconducting sublayer 21 to the substrate 10. The strained sublayer 22 is formed on the first surface of the first semiconducting sublayer 21. The first semiconducting sublayer 21 may be formed as a continuous sublayer across the surface of the substrate 10.

The first semiconducting sublayer 21 has a first in-plane lattice constant. The first semiconducting layer may have a wurtzite crystal structure. In some embodiments, the first semiconductor sublayer 21 may be formed on the substrate with a (0001) crystal plane provided parallel to a surface of the substrate 10. So, for first semiconductor sublayers having a first surface aligned with a (0001) crystal plane, an in-plane lattice constant may be a constant reflecting the a (or b) lattice constants.

As shown in FIG. 1, the strained sublayer 22 is formed on the first surface of the first semiconducting sublayer 21. The strained sublayer 22 comprises a Group III-nitride. The strained sublayer 22 includes a strained surface on an opposite side of the strained sublayer 22 to the substrate 10 (and the first semiconducting sublayer 21).

The strained sublayer 22 is formed with a crystal structure which may be coherent with the first semiconducting sublayer 21. As such, the interface between the first semiconducting sublayer 21 and the strained sublayer 22 may be a coherent interface. Following a heat treatment step (discussed in more detail below), the strained sublayer 22 relaxes to form a strain relaxed sublayer. The strain relaxed sublayer has a strain relaxed surface 23 with a second in-plane lattice constant. The second in-plane lattice constant is larger than the first in-plane lattice constant of the first semiconducting sublayer 21. In some embodiments, the strain relaxed sublayer may have a wurtzite crystal structure, similar to the first semiconducting sublayer 21. In some embodiments, the strain relaxed sublayer may be formed on the substrate with a (0001) crystal plane provided parallel to a surface of the substrate 10. The strain relaxed surface 23 may also be aligned with a (0001) crystal plane. So, the in-plane lattice constant for the strain relaxed surface 23 may be a constant reflecting the a-plane (or b-plane) lattice constants of the crystal structure.

The strain relaxed sublayer (which is formed from the strained sublayer 22) may provide the strain relaxed surface 23 in a variety of ways.

In some embodiments, the strained sublayer 22 may be deposited as a single continuous layer. For example, the strained sublayer 22 may comprise a Group III-nitride having a uniform composition. For example, the strained sublayer 22 may comprise $In_XGa_{1-X}N$, where $0<X\leq1$. In some embodiments, the strained sublayer 22 may comprise $In_XGa_{1-X}N$, where $0<X\leq0.5$, or where $0.1\leq X\leq0.4$. In particular, the strained sublayer 22 may have a higher In content than the first semiconducting sublayer 21. For example, in the embodiment of FIG. 1, the first semiconducting sublayer 21 comprises GaN. Accordingly, the increased In content of the strained sublayer 22 relative to the first semiconducting sublayer 21 results in the strain relaxed sublayer relaxing to a second lattice constant with the desired increase in the in-plane lattice constant of the strain relaxed surface 23.

In some embodiments, the strained sublayer 22 may be provided as a single continuous layer, wherein the composition of the strained sublayer 22 changes gradually through the thickness of the sublayer. For example, the strained sublayer 22 may comprise $In_XGa_{1-X}N$ where the In content (X) of the strained sublayer 22 e.g. increases or decreases in the thickness direction. For example in some embodiments, the In content (X) of the strain relaxed sublayer decreases in the thickness direction away from the first semiconducting sublayer 21 (i.e. towards the strained surface 23). As such, the strained sublayer 22 may be single sublayer of $In_XGa_{1-X}N$, wherein the composition (i.e. the In content X) is graded in the thickness direction.

In some embodiments, the strained sublayer 22 may be formed from a plurality of layers (i.e. sub-sublayers). The strained sublayer 22 may comprise a plurality of first strain layers each having a third lattice constant and a plurality of second strain layers each having a fourth lattice constant. The first and second strain layers may be arranged in an alternating manner on top of each other to form the strained sublayer 22. As such, each of the first and second strain layers may be formed as a continuous layer on top of each other. In order to provide the strain relaxed surface, the third and fourth lattice constants of the first and second strain layers are different. In some embodiments, the fourth lattice constant is greater than the third lattice constant.

For example, in one embodiment, the first strain layer may comprise GaN (i.e. the third lattice constant may be equal to the first lattice constant), and the second strain layer may comprise $In_XGa_{1-X}N$, where $0<X\leq1$, $0<X\leq0.5$, or $0.1\leq X\leq0.4$. The strain relaxed surface may be provided by either a first strain layer or a second strain layer. In other embodiments, the first strain layer may comprise $In_{X1}Ga_{1-X1}N$, where $0<X1\leq1$, $0<X1\leq0.5$, or $0.1\leq X1\leq0.4$ (i.e. the third lattice constant may be different to the first lattice constant), and the second strain layer may comprise $In_{X2}Ga_{1-X2}N$ where $0<X2\leq1$, $0<X2\leq0.5$, or $0.1\leq X2\leq0.4$.

In some embodiments, the composition of one or more of the first and second strain layers may vary through the thickness of the strain relaxed sublayer. For example, the In content of the fourth strain layers may vary through the thickness of the strained sublayer 22.

Importantly, the compressive strain at the interface between the strained sublayer 22 and the first semiconducting sublayer 21 may result in dislocations propagating when the strained sublayer 22 relaxes during the heat treatment process. By grading the In-content of the strained sublayer 22, the compressive strain may be higher at the interface and reduce towards the strained sublayer surface. Accordingly, during relaxation dislocations may preferentially propagate substantially in an in-plane direction, rather than in a thickness direction. By providing the strain relaxed sublayer with a higher In content towards the first semiconducting sublayer 21, the formation of misfit dislocations in the strain relaxed sublayer may be promoted in a region away from the strain relaxed surface 23 (i.e. in a region of higher compressive strain). That is to say, the formation of dislocations may be controlled to propagate in regions away from the growth surface 25 of the first semiconductor layer 20, thereby reducing the influence of lattice mismatch (dislocations) on the electrical properties of the LED precursor 1.

The strained sublayer 22 may be formed on the first semiconducting sublayer 21 by any growth method suitable for the growth of Group III-nitrides. The strained sublayer 22 may be formed as a continuous layer covering substantially an entire major surface of the first semiconducting sublayer 21. The strained sublayer 22 may be deposited using any suitable process for the fabrication of Group III-nitride thin films, for example, Metal Organic Chemical Vapour Deposition (MOCVD), or Molecular Beam Epitaxy (MBE).

The growth surface 25 of the first semiconducting layer 20 may be subsequently shaped using a selective removal process. As such, portions of the first semiconducting layer 20 are selectively removed to form a mesa structure 24 such that the growth surface 25 of the first semiconducting layer 20 comprises a bulk semiconducting layer surface 26 and a mesa surface 27.

Figure 2:
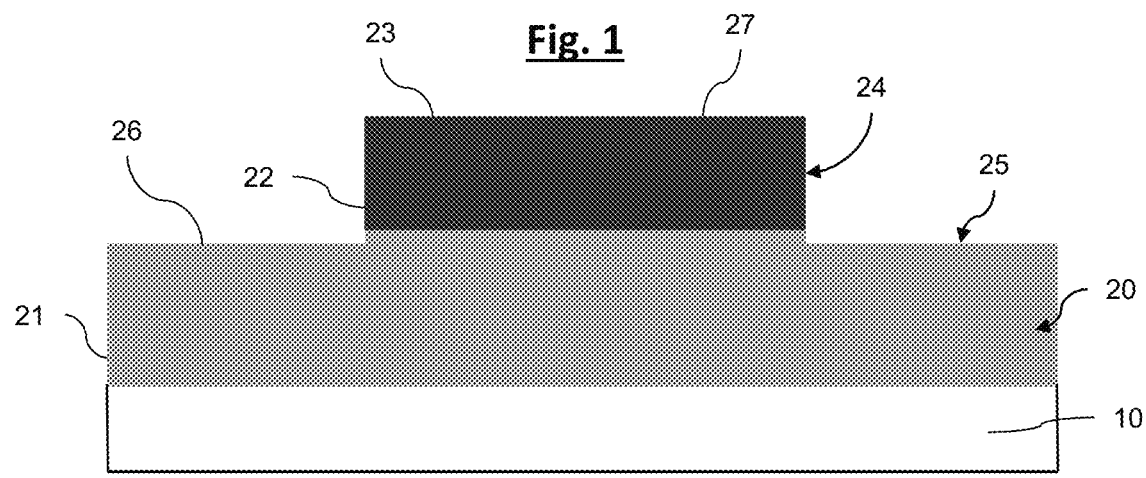
FIG. 2 shows a diagram of an intermediate step of a method according to an embodiment of the disclosure in which a first semiconducting layer including a mesa structure is provided.

For example, in FIG. 2 the growth surface 25 has been shaped using an etching process. In the etching process, a mesa-defining mask layer (not shown) may be deposited on the strained surface of the first semiconducting layer 20. The mesa-defining mask layer is configured to mask a portion of the first semiconductor layer 20 which is intended to form a mesa structure 24 having a mesa surface 27 of the growth surface 25. Un-masked portions of the first semiconducting layer 20 may then be selectively removed using an etchant. The etchant may etch away portion of the first semiconducting layer 20 to expose a bulk semiconducting layer surface 26 of the first semiconducting layer 20. That is to say, the etchant may not etch completely through the thickness of the first semiconducting layer 20 to expose the substrate 10 below. The mesa-defining mask layer may then be removed from the first semiconductor layer. By following the above process, the first semiconducting layer 20 may be shaped to provide a mesa structure 24 which is provided monolithically on a bulk semiconductor layer surface 26, for example as shown in FIG. 2.

The mesa surface 27 is provided by a portion of the strained sublayer 22 which is not selectively removed. Accordingly, the alignment of the portion of the strained sublayer 22 forming the mesa surface 27 may be unchanged with respect to the substrate 10 following the selective removal step. Thus, as shown in FIG. 2, the mesa surface 27 may be parallel to a surface of the substrate 10. In some embodiments, the first semiconducting sublayer 21 is etched such that the bulk semiconductor surface 26 is also substantially parallel to the substrate 10. Accordingly, the mesa surface 27 and the bulk semiconductor surface 26 of the first semiconductor layer 20 may both be surfaces which are substantially parallel to each other. In some embodiments, the mesa surface 27 and the bulk semiconductor surface 26 may be aligned with (0001) planes of the Group III-nitride forming the first semiconducting layer 20.

In the embodiment shown in FIG. 2, the first semiconducting layer 20 is etched such that a bulk semiconducting surface of the first semiconducting sublayer 21 is exposed. As such, the first semiconducting layer 20 has been etched through the thickness of the strained sublayer 22 and partially through the thickness of the first semiconducting sublayer 21.

In FIG. 2, the mesa structure 24 is shown with sidewalls which are substantially perpendicular to the bulk semiconducting surface 26 and the mesa surface 27. In other embodiments, the mesa structures 24 may be formed with inclined sidewalls. For example, different etchants may be used to control the shape of the sidewalls formed during the selective removal process.

Following the formation of the first semiconducting layer 20, the strained sublayer 22 may be subjected to a heat treatment step. The heat treatment step may comprise heating the strained sublayer 22 to a temperature sufficient to cause plastic deformation of the strained sublayer 22. That is to say, the strained sublayer 22 is heated to a temperature wherein thermal expansion of the strain relaxed sublayer relative to the first semiconducting sublayer 21 results in plastic deformation of the strained sublayer 22. Plastic deformation of the strained sublayer 22 may result in the formation of dislocations towards the interface between the strained sublayer 22 and the first semiconducting sublayer 21. For example, the compressive stress present in the strained sublayer 22 during the heat treatment step may result in plastic deformation of the strained sublayer 22. The plastic deformation occurs through the propagation of misfit dislocations substantially across the c-planes of the strained sublayer 22 (i.e. misfit dislocation glide in a c-plane), rather than in a direction transverse to the c-plane. The propagation of the dislocations across the strained sublayer 22 relieves at least some of the strain in the strained sublayer 22 such that a strain relaxed sublayer is formed. As such, the strain relaxed sublayer 22b may be formed through the propagation of misfit dislocations rather than threading dislocations. Consequently, the heat treatment step may reduce the strain in a region of the mesa structure above the narrow band in which the dislocations propagate (i.e. in a region of the mesa structure above the interface between the first semiconducting sublayer 21 and the strain relaxed sublayer). Accordingly, the region above the band of dislocations including the strain relaxed surface 23 may have reduced strain relative to the surface prior to the heat treatment step. A reduction in strain of the strain relaxed surface 23 may increase an in-plane lattice constant of the strain relaxed surface 23. Further discussion of the propagation of misfit dislocations in the presence of a mesa structure may be found in at least Mei et al., Basal-plane slip in InGaN/GaN heterostructures in the presence of threading dislocations, Applied Physics Letters, vol. 90, 2007, and Floro J. A. et al., Misfit dislocation formation in the AlGaN/GaN heterointerface, Journal of Applied Physics, Vol. 96, 2004.

The heat treatment step may be provided by any suitable method for annealing a material. For example, the heat treatment step may be provided by heating the strain relaxed sublayer 21 on the substrate 10 from room temperature up to a first heat treatment temperature. The strain relaxed sublayer 21 may be held at the first heat treatment temperature for a first time period. The strain relaxed sublayer 21 may then be cooled back to room temperature. The heat treatments step may be performed in air, for example on a hot plate, or in an oven. The heat treatment step may also be performed in a controlled atmosphere. In a controlled atmosphere, atmospheric compounds such as oxygen and water may be significantly reduced or excluded entirely. For example, a controlled atmosphere may be an $NH_3$, Ag or $N_2$ atmosphere. In some embodiments, the heat treatment step may be performed under a controlled atmosphere comprising $N_2$ and $NH_3$. Performing the heat treatment step under a controlled atmosphere may reduce or eliminate any undesirable chemical reactions occurring on the surface of the strained sublayer 22 during the heat treatment step.

In some embodiments, the heat treatment step may heat the strained sublayer 22 to a first heat treatment temperature of at least 500° C. In some embodiments, the first heat treatment temperature may be at least 800° C., 950° C., 1000° C., or 1050° C. The first time period may be at least 5 minutes. In some embodiments, the first time period may be at least: 10 minutes, 20 minutes, 30 minutes, or 1 hour. For example, in some embodiments, a hear treatment step may comprise heating the strain relaxed sublayer to 800° C. and holding the strain relaxed sublayer at this temperature for 1 hour, followed by cooling to room temperature. At higher first heat treatment temperatures, the first time period may be reduced (e.g. a first time period of 5 minutes for a heat treatment temperature of 1050° C.).

Importantly, where the strain relaxed sublayer comprises a graded, or variable, content through its thickness, the heat treatments step may cause dislocations to propagate through regions of the strain relaxed sublayer having a higher lattice mismatch at a lower heat treatment temperature than regions of the strain relaxed sublayer having a lower lattice mismatch. Thus, by providing a strain relaxed sublayer with a graded or variable composition, the propagation of dislocations through the strain relaxed sublayer may be further promoted to occur in a specific region, or band, of the strain relaxed sublayer 22. An example of this effect is discussed in more detail below in relation to FIG. 5.

In some embodiments, the heat treatment step may be performed in situ, following the formation of the first semiconducting layer 20. In other embodiments, the heat treatment step may be performed following the formation of the mesa structure 24. For example, in some embodiments, the heat treatment step may be performed in situ prior to the deposition of the second semiconducting layer 30.

Next, a monolithic LED structure may be formed on the growth surface 25 of the first semiconductor layer 20. The monolithic LED structure covers the mesa surface 27 and the bulk semiconducting layer surface 26. The monolithic LED structure comprises a plurality of layers, wherein each layer comprises a Group III-nitride. In some embodiments, the Group III-nitrides comprise one of more of AlInGaN, AlGaN, InGaN and GaN.

A monolithic LED structure refers to the provision of an LED structure formed as a single piece. That is to say, the monolithic LED structure is formed as a single piece on the first semiconductor layer.

Figure 3:
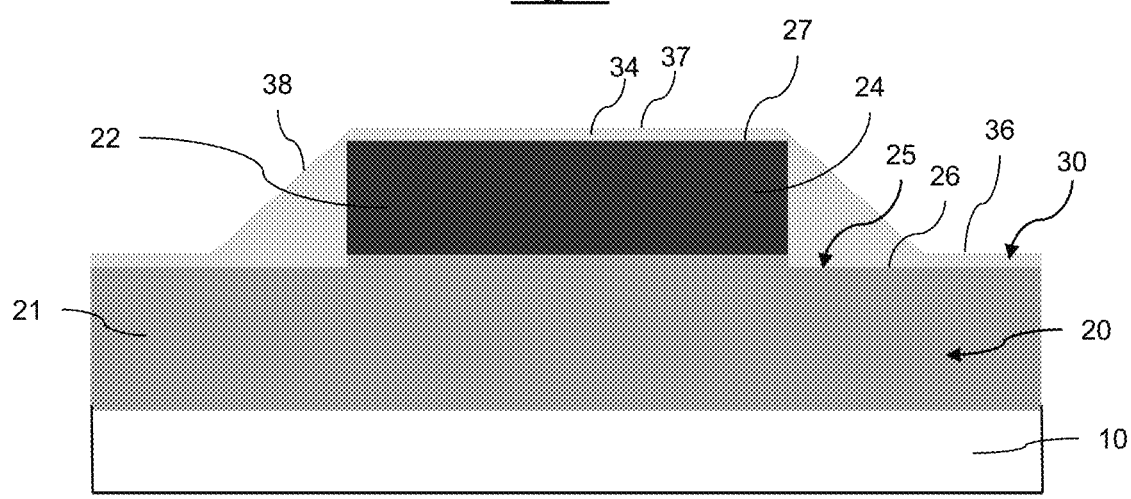
FIG. 3 shows a diagram of an intermediate step of a method according to an embodiment of the disclosure in which a first semiconducting layer with an overgrown second semiconducting layer is provided.

In one embodiment of the disclosure, as shown in FIG. 3, a second semiconducting layer 30 may be deposited on the first semiconducting layer 20. The second semiconducting layer 30 is formed on the first semiconducting layer 20 on an opposite side of the first semiconducting layer 20 to the substrate 10. As such, the second semiconducting layer 30 forms the first of the plurality of layers of the monolithic LED structure.

The second semiconducting layer 30 may be formed on the growth surface 25 by any suitable growth method for the growth of Group III-nitrides. In the embodiment of FIG. 2, the second semiconducting layer 30 is formed monolithically over the growth surface 25 (i.e. an overgrowth method). The second semiconductor layer 30 may be formed as a continuous layer covering substantially the entire growth surface 25. The second semiconducting layer 30 may be deposited using any suitable process for the fabrication of Group III-nitride thin films, for example, Metal Organic Chemical Vapour Deposition (MOCVD), or Molecular Beam Epitaxy (MBE).

The second semiconducting layer 30 comprises a Group III-nitride. In FIG. 3, the second semiconducting layer 30 comprises GaN. The second semiconducting layer may be n-type doped. The GaN may be n-typed doped using a suitable dopant, for example Si, or Ge. In FIG. 3, the second semiconducting layer 30 is not intentionally doped. As such, the second semiconducting layer 30 may be a (substantially) undoped layer. By substantially undoped, it is understood that the Group III-nitride layer does not include any significant quantity of a dopant elements, whilst appreciating that some impurities may be present as a result of the fabrication process. As such, the substantially undoped Group III-nitride may be not intentionally doped. By forming the second semiconducting layer 30 from an undoped semiconductor, the flow of charge carriers through the LED may be more efficiently confined in the mesa structure 24.

In some embodiments, the second semiconducting layer 30 may comprise $In_YGa_{1-Y}N$, where $0<Y\leq1$. For example, in some embodiments the second semiconducting layer 30 comprises $In_YGa_{1-Y}N$, where $0<Y\leq0.15$. In some embodiments, the second semiconducting layer 30 may comprise an n-type dopant (i.e. the second semiconducting layer may be n-type doped). By incorporating In into the second semiconducting layer 30, the in-plane lattice constant of the second semiconducting layer 30 may be increased relative to an in-plane lattice constant of GaN. Such an increase may reduce a lattice mismatch between the second semiconducting layer 30 and the active layers 40. For example, in some embodiments where the active layer 40 is configured to output light having a wavelength of at least 620 nm, the second semiconducting layer 30 may comprise $In_YGa_{1-Y}N$, where $0.05\leq Y\leq0.15$.

By growing the second semiconducting layer 30 on the first semiconducting layer 20, the second semiconducting layer 30 may have a crystal structure which corresponds to the crystal structure of the first semiconducting layer 20. In particular, a first portion of the second semiconducting layer 34 formed on the mesa surface 27 may have a crystal structure which is influenced by the in-plane lattice constant of the strain relaxed surface 23 forming the mesa surface 27. For example, where the mesa surface 27 of the first semiconducting layer 20 is aligned with the (0001) plane of a Group III-nitride, the second semiconducting layer 30 may also be grown with a similar crystal orientation.

In the embodiment of FIG. 3, the second semiconducting layer 30 is formed on the growth surface 25 to provide an inclined sidewall portion 38 extending between a first portion of the second semiconducting layer 34 on the mesa surface 27 of the first semiconducting layer and a second portion of the second semiconducting layer 36 on the bulk semiconducting surface 26 of the first semiconducting layer. Accordingly, the second semiconducting layer 30 can be overgrown on the mesa structure 24 of the first semiconducting layer 20 to provide a Group III-nitride semiconducting layer comprising a second semiconducting layer mesa surface 37 and surrounded by inclined sidewall portions 38. Effectively, the second semiconductor layer 30 may be overgrown on the mesa structure 24 to form a column having a regular trapezoidal cross-section normal to the substrate, wherein the second semiconducting layer mesa surface 37 forms the substantially flat upper surface of the trapezoidal cross section. The second semiconducting layer mesa surface 37 may be aligned with plane parallel to the substrate surface on which the layers are formed.

By "regular trapezoidal cross-section" it is meant that the column is narrower at the top surface (covering the mesa surface 27) than the bottom (towards the bulk semiconducting surface 26) and that it has a substantially flat upper surface, with sloped linear sides. This may result in a frustroconical shape, or more likely a frustropyramidal shaped having 3 or more sides, typically 6 sides. The trapezoidal cross-section is formed from the mesa structure 24 of the first semiconducting layer, the first portion of the second semiconducting layer 34, and the inclined sidewall portion(s) of the second semiconductor layer 38 grown over the mesa structure 24. As such, the regular trapezoidal cross section extends above the continuous planar second portion of the second semiconductor layer 36. The tapering sides of the trapezoidal cross section of the column are referred to herein as inclined sidewall portions 38.

In some embodiments, the inclined sidewall portions 38 of the columns have a substantially consistent angle ($\alpha$) to a plane parallel to the first semiconductor layer. That is, the angle between the side of the columns and a plane parallel to the first semiconductor does not change significantly. For example, the angle $\alpha$ is between 50° and 70°, more preferably it is between 58° and 64°, most preferably about 62°.

Accordingly, in some embodiments, the inclined sidewall portions 38 of the columns may be inclined with respect to the (0001) plane of the crystal structure of the first semiconducting layer 20. The inclined sidewalls may generally be oriented along the $\{1\bar{1}\ 0\ 1\}$ or $\{1\bar{1}\ 0\ 2\}$ planes of the wurtzite crystal and present reduced polarisation fields compared with c-plane surfaces (semi-polar surfaces), similar to the structures produced by SAG.

In some embodiments, the column in the second semiconductor layer 30 is a truncated hexagonal pyramid.

Figure 4:
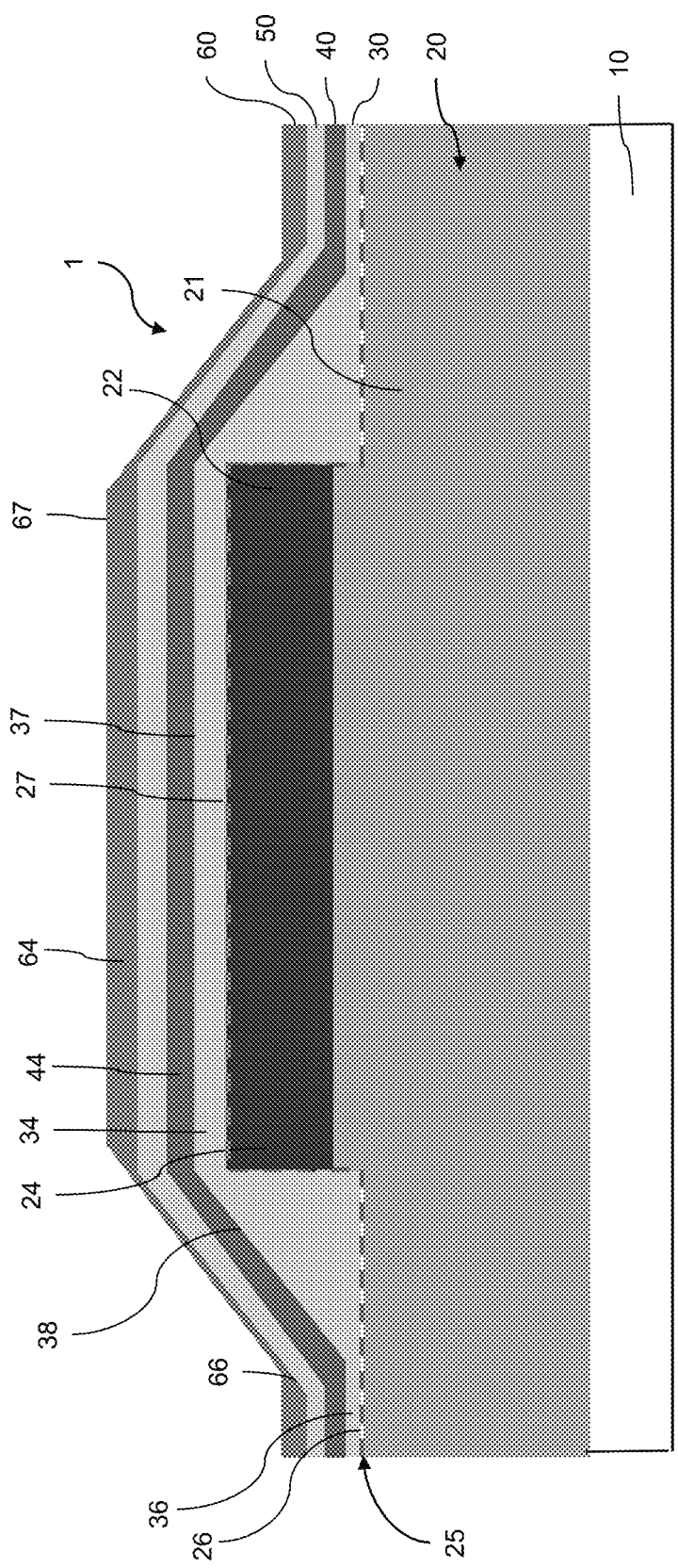
FIG. 4 shows a diagram of a LED precursor according to an embodiment of the disclosure in which a monolithic LED structure is provided on a first semiconducting layer.

Following the formation of the second semiconducting layer 30, further layers of the monolithic LED structure may be formed thereon. FIG. 4 shows an example of a LED precursor in which further layers of the monolithic LED structure have been formed on the intermediate structure of FIG. 3.

As shown in FIG. 4, an active layer 40 may then be formed on the second semiconducting layer 30. The active layer 40 is configured to generate light of a first wavelength as part of the monolithic LED structure.

In the embodiment of FIG. 4, the active layer 40 may comprise one or more quantum well layers (not shown). As such, the active layer 40 may be a multiple quantum well layer. The quantum well layers within the active layer 40 may comprise a Group III-nitride semiconductor, preferably a Group III-nitride alloy including In. For example, in the embodiment of FIG. 2 the active layer 40 may comprise alternating layers of GaN and $In_ZGa_{1-Z}N$, where $0<Z\leq1$. In particular, in some embodiments, the active layer may comprise $In_ZGa_{1-Z}N$ layers where $0.2\leq Z\leq0.5$. As such, the active layer 40 of the LED in some embodiments may be configured to output light having a wavelength of at least 540 nm. The thickness and In content of the quantum well layer may be controlled in order to control the wavelength of light generated by the active layer. The active layer 40 may be formed as a continuous layer covering a substantial portion (e.g. all) of the exposed surface of the second semiconductor layer 30. The active layer 40 may be deposited using any suitable process for the fabrication of Group III-nitride thin films, for example, Metal Organic Chemical Vapour Deposition (MOCVD), or Molecular Beam Epitaxy (MBE).

The active layer 40 may comprise a strain interface layer (not shown).

The deposition of the active layer 40 on the second semiconductor layer 30 may occur with a relatively high deposition rate on the first portion of the second semiconducting layer 35 on the mesa surface 27, and with a significantly lower deposition rate on the inclined sidewalls. This effect results from the different crystal plane alignment of the various surfaces, resulting in a thicker active layer 40 over the mesa surface 27 than on the inclined sidewalls 35. This effect is described in more detail in GB1811190.6.

Further layers of the monolithic LED structure may then be deposited on the active layer 40 on an opposite side of the active layer 40 to the second semiconducting layer 30. FIG. 4 shows an example of a plurality of layers forming a monolithic LED structure which have been formed on a growth surface 25 of a first semiconducting layer 20. The plurality of layers of the monolithic LED structure may each be formed as a continuous layer.

In the embodiment of FIG. 4, an electron blocking layer 50 is provided on the active layer 40. The electron blocking layer 50 is provided on a side of the active layer 40 opposite to a side of the active layer 40 on which the second semiconducting layer 30 is provided. The electron blocking layer 50 comprises a Group III-nitride. The electron blocking layer 50 may be formed as a continuous layer covering a substantial portion (e.g. all) of the exposed surface of the active layer 40. The electron blocking layer 50 is configured to reduce electron flow from the active layer 30 into the p-type semiconducting layer 60 of monolithic LED structure. For example, in some embodiments, the electron blocking layer 50 may comprise $Al_wGa_{1-w}N$, where $0<w\leq1$. Further details of suitable electron blocking layers 50 may be found in at least APPLIED PHYSICS LETTERS 103, 061104 (2013).

As shown in FIG. 3, a p-type semiconducting layer 60 is provided over the active layer 40. The p-type semiconducting layer 60 is provided on a side of the electron blocking layer 50 opposite the side of the electron blocking layer 50 on which the active layer 40 is provided. The p-type semiconducting layer 60 comprises a Group III-nitride. The p-type semiconducting layer 60 is doped with a suitable electron acceptor, for example Mg. The p-type semiconducting layer 60 may be formed as a continuous layer covering a substantial portion (e.g. all) of the exposed surface of the active layer 40 (or electron blocking layer 50 if present).

Accordingly, the p-type semiconducting layer 60 may be provided with a first portion 64 which is substantially aligned with the mesa structure 24. That is to say, a surface of the first portion of the p-type semiconducting layer 67 is provided over the mesa surface 27 (i.e. the centres of the respective surfaces 27, 67 may be aligned). The p-type semiconducting layer 60 also comprises a second portion 66 which covers at least a portion of the bulk semiconductor surface 26 away from the mesa surface 24. As such, the monolithic LED structure may generally be considered to have a first portion provided over the mesa surface 27 and a second portion which covers at least a portion of the bulk semiconductor surface 26 away from the mesa surface 27.

Figure 5:
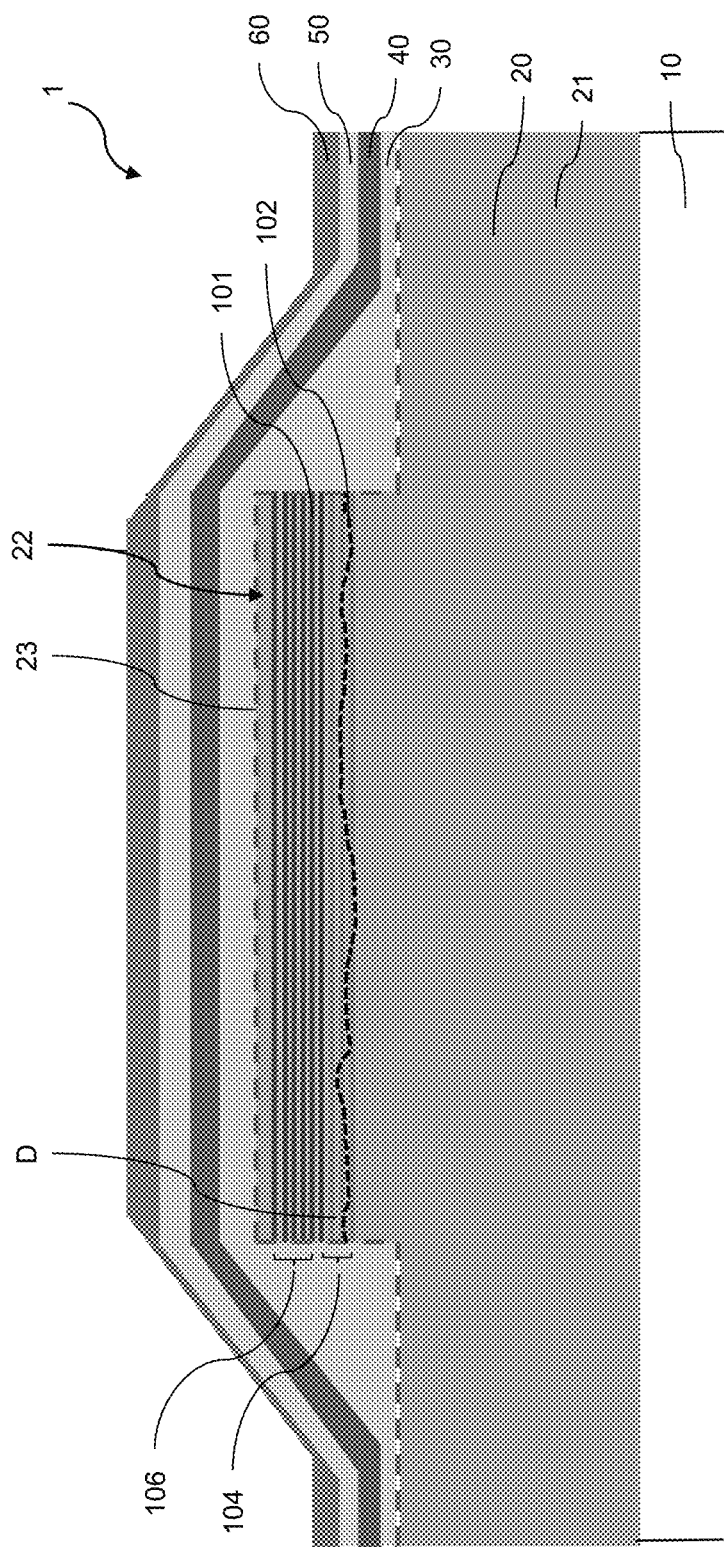
FIG. 5 shows a diagram of an LED precursor according to an embodiment of the disclosure in which the strained sublayer comprises a plurality of first and second strain layers.

FIG. 5 shows an embodiment of a LED precursor 1 according to this disclosure. Similar, to the embodiment of FIG. 4, the LED precursor 1 comprises a first semiconducting layer 20, a second semiconducting layer 30, an active layer 40 an electron blocking layer 50 and a p-type semiconducting layer 60. Accordingly, these layers may be formed in accordance with the methods as described above.

The first semiconducting layer 20 comprises a first semiconducting sublayer 21 and a strain relaxed sublayer 6. As shown in FIG. 5, the strain relaxed sublayer comprises a plurality of layers. It will be appreciated from the above discussion that the strain relaxed sublayer of FIG. 5 may be formed from a strained sublayer 22 comprising alternating first and second strain layers following a heat treatment step.

The strain relaxed sublayer of FIG. 5 comprises a plurality of first strain layers 101. The first and second strain layers 101, 102 are arranged in an alternating manner on top of each other. As such, each of the first and second strain layers 101, 102 are formed as a continuous layer on top of each other.

In the embodiment of FIG. 5, the first strain layer comprises GaN (i.e. the third lattice constant may be equal to the first lattice constant), and the second strain layer 102 comprises $In_XGa_{1-X}N$, where $0<X\leq1$, $0<X\leq0.5$, or $0.1\leq X\leq0.4$. The strain relaxed surface may be provided by a first strain layer 101 or a second strain layer 102. In the embodiment of FIG. 5, the strain relaxed surface 23 is provided by a first strain layer 101.

In the embodiment of FIG. 5, the composition of the second strain layers 102 varies through the thickness of the strain relaxed sublayer. In the embodiment of FIG. 5 a first set 104 of the second strain layers 102 are provided with a first composition, and a second set 106 of the second strain layers 102 are provided with a second composition. The first and second compositions may be provided such that an in-plane lattice constant of the second set 106 of the second strain layers 102 is lower than an in-plane lattice constant of the first set 104 of the second strain layers 102. For example, in the embodiment of FIG. 5, the first set 104 of the second strain layers 102 comprises $In_{X3}Ga_{1-X3}N$, where $0.1\leq X3\leq0.4$, and the second set 106 of the second strain layers 102 comprises $In_{X3}Ga_{1-X3}N$, where $0<X3\leq0.15$. Thus, it will be appreciated the embodiment of FIG. 5 provides an example of a strain relaxed sublayer (formed from a strained sublayer 22) having a graded composition, as described above.

Accordingly, the first set 104 of the second strain layers 102 may provide a region of the mesa structure 24 where the strain is locally higher than a region of the mesa structure 24 in which the second set 106 of the second strain layers 102 is provided. Consequently, the formation of misfit dislocations may be promoted in the region of the mesa structure where the first set 104 of the second strain layers 102 is located. As shown in FIG. 4, the first set 104 of the second strain layers 102 are provided towards the first semiconducting sublayer 21, and away from the strain relaxed surface 23. Accordingly, the dislocations (indicated by dashed line D in FIG. 5) may propagate in a region of the mesa structure away from the monolithic LED structure.

In order to improve charge carrier confinement in the active layer over mesa surface 27 of the LED, methods according to this disclosure may form a potential barrier between first portion of the monolithic LED structure covering the mesa surface 27 and a second portion of the monolithic LED structure covering the bulk semiconducting surface 26, wherein the potential barrier surrounds the first portion of the p-type semiconducting layer 64 covering the mesa surface 27. That is to say, methods according to this disclosure provide a potential barrier between an upper contact surface of the substantially flat surface of the regular trapezoidal shape and the layers formed over the bulk semiconducting surface 26.

One method for forming such a potential barrier is shown in schematically in FIGS. 3 and 4. The embodiments of FIGS. 6 and 7 show further processing steps following fabrication of the device as shown in FIG. 4.

Figure 6:
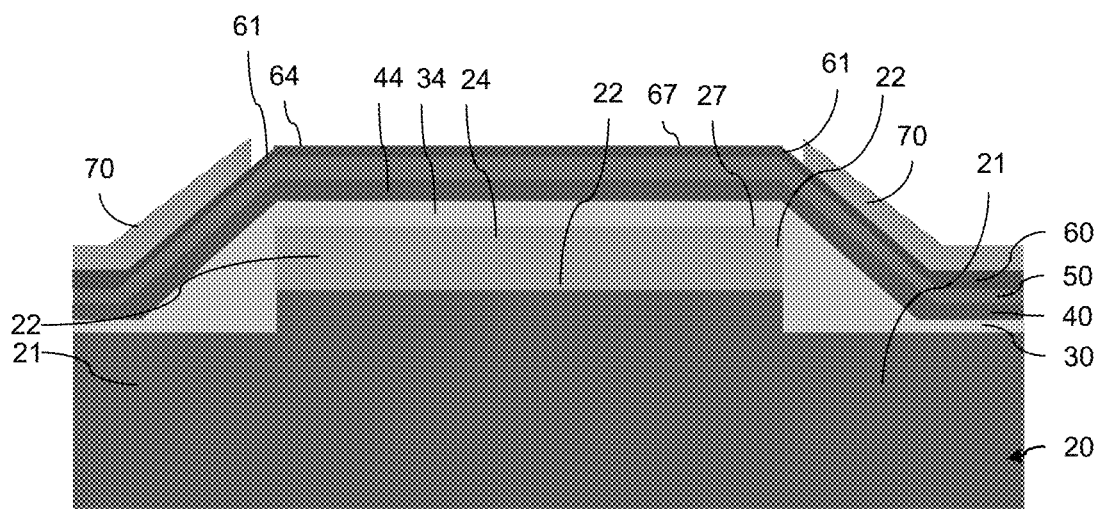
FIG. 6 shows a diagram of an LED precursor according to an embodiment of the disclosure in which a mask layer is provided on the LED precursor of FIG. 4.

In FIG. 6, a mask layer 70 is formed on a surface of the p-type semiconducting layer 60 on an opposite side of the p-type semiconducting layer 60 to the electron blocking layer 50.

The mask layer 70 may be selectively provided on the p-type semiconducting layer 60. The mask layer 70 may be provided to define one or more apertures. The apertures may be configured to expose regions of the p-type semiconducting layer 60 which are to be selectively removed. For example, the apertures may define a third portion of the p-type semiconducting layer 61 encircling the first portion 64 of the p-type semiconducting layer covering the mesa structure. The third portion of the p-type semiconducting layer 61 may then be selectively removed, for example by etching, in order to provide the potential barrier. For example in the embodiment of FIG. 6, the third portion of the p-type semiconducting layer 61 is an inclined sidewall portion of the p-type semiconducting layer 60.

Figure 7:
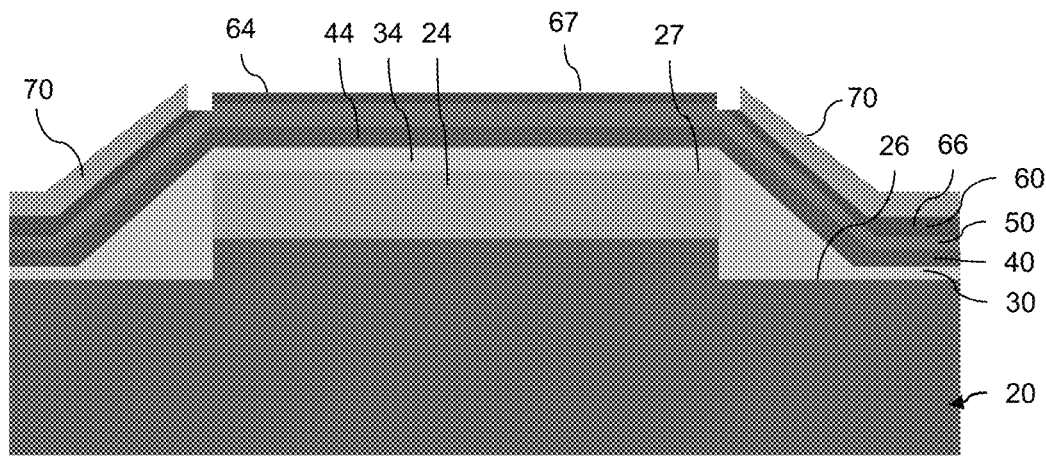
FIG. 7 shows a diagram of a LED precursor according to an embodiment of the disclosure including a potential barrier.

In the embodiment of FIGS. 6 and 7, an anisotropic etchant may be used to selectively remove the third portion of the p-type semiconducting layer 61. An anisotropic etchant, for example KOH, may preferentially etch the inclined sidewall regions of a Group III-nitride at a faster rate than the planar surfaces aligned parallel with the substrate (for example surface aligned with a (0001) crystal plane). Accordingly, the mask layer 70 may be provided to define apertures which are aligned with, and expose, the surface of the first portion of the p-type semiconducting layer 67 and a third portion of the p-type semiconducting layer 61 corresponding to an inclined sidewall region of the p-type semiconducting layer 60. The anisotropic etchant may then preferentially etch the p-type semiconductor layer 60 in the inclined sidewall region at a significantly higher rate in order to remove the desired amount of material.

FIG. 7 shows a schematic diagram of the resulting LED precursor following the formation of a potential barrier by selective removal of the third portion of the p-type semiconducting layer 61. As shown in FIG. 7, the p-type semiconducting layer 60 is selectively removed through thickness of the layer to expose the layer below (the electron blocking layer 50 in the embodiment of FIG. 7). As such, the selective removal step forms a channel in the monolithic LED structure which encircles the first portion of the p-type semiconducting layer 64. Thus, a potential barrier is formed in the p-type semiconducting layer 60 between a first portion of the p-type semiconducting layer 67 covering the mesa surface 27 and a second portion of the p-type semiconducting layer 66 covering the bulk semiconducting surface 26. The potential barrier is provided in order to increase confinement of charge carriers in the portion of the active layer 40 covering the mesa structure 24 during operation.

In other embodiments of methods according to this disclosure, the depth of the channel which is selectively removed may be varied. For example, in some embodiments, the channel may only extend partially through the thickness of the third portion of the p-type semiconducting layer 61. By reducing the thickness of the third portion of the p-type semiconducting layer 61, in combination with the variation in deposition rate of the monolithic LED structure on the sidewall surface noted above, the remaining part of the third portion of the p-type semiconducting layer 61 may be present a significant resistance between the first and second portions of the p-type semiconducting layer 64, 66, such that a potential barrier is effectively provided. In other embodiments, the channel may extend, at least partially, through the thickness of one or more of the other layers of the monolithic LED structure.

Figure 8:
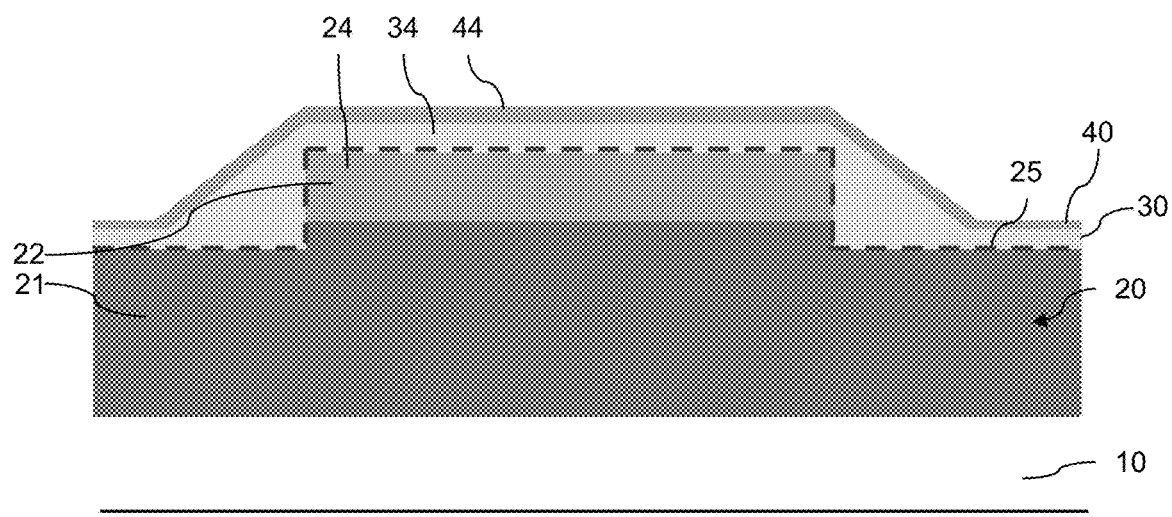
FIG. 8 shows a diagram of an intermediate step of a method according to an embodiment of the disclosure in which an active layer of a monolithic LED structure is provided on a first semiconducting layer.
Figure 9:
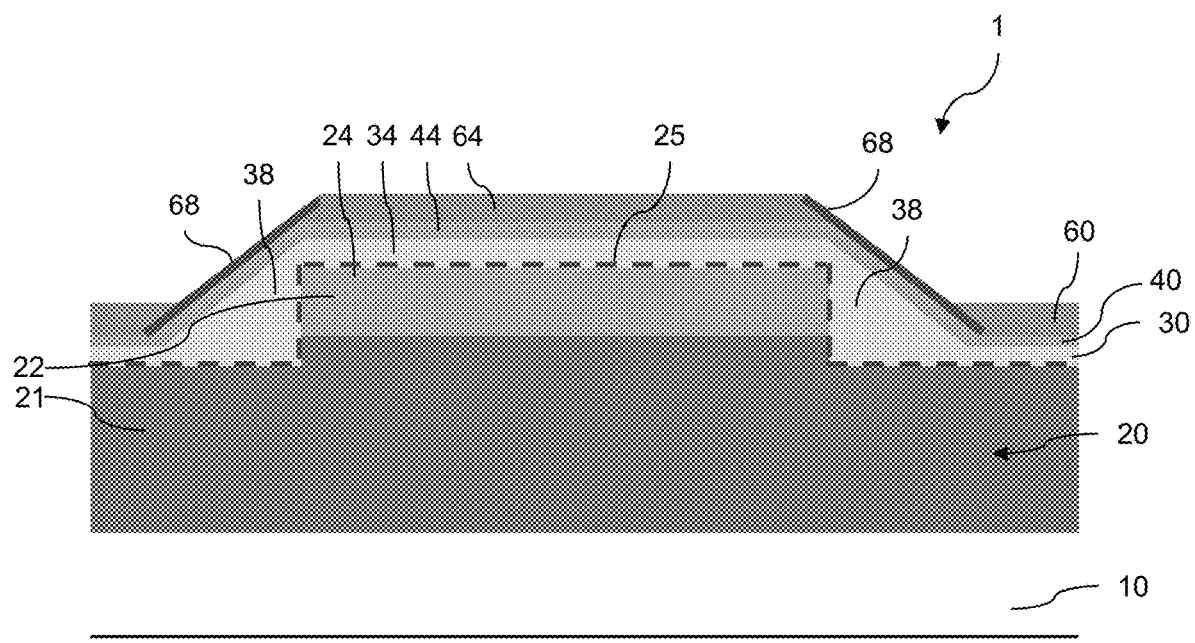
FIG. 9 shows a diagram of a LED precursor according to another embodiment of the disclosure including a potential barrier.

A further method for forming such a potential barrier is shown in schematically in FIGS. 8 and 9.

FIG. 8 shows an intermediate structure comprising a first semiconducting layer 20, a second semiconducting layer 30, and an active layer 40. The structure of FIG. 8 may be formed by at least the method steps as discussed above in relation to FIGS. 1-4.

Following the forming of the intermediate structure of FIG. 8, a p-type semiconducting layer 60 is formed on the active layer 40, as shown in FIG. 9. The p-type semiconducting layer 60 is formed on an opposite side of the active layer 40 to the second semiconducting layer 30. In some embodiments, an electron blocking layer 50 may be provided between the p-type semiconducting layer 60 and the active layer 40 as shown in FIG. 3.

In the embodiment of FIG. 9, the p-type semiconducting layer 60 comprises a Group III-nitride including Al. The p-type semiconducting layer 60 may be formed such that a higher concentration of Al is incorporated into a sidewall portion 68 of the p-type semiconducting layer than a first portion of the p-type semiconducting layer 64 covering the mesa surface 27 such that a potential barrier is provided between the sidewall portion of the p-type semiconducting layer 68 and the first portion of the p-type semiconducting layer 64. The difference in Al composition between the sidewall portion 68 and the first portion of the p-type semiconducting layer 64 may be such that the change in bandgap between the first portion 64 and the sidewall portion 68 is larger than kT eV at room temperature (i.e. greater than about 0.26 eV).

For example, the sidewall portion of p-type semiconducting layer 68 may comprise p-type $Al_xGa_{1-x}N$, wherein $2 \leq x \leq 50\%$, and the first portion of the p-type semiconducting layer 64 may comprise p-type $Al_yGa_{1-y}N$, wherein $1 \leq y \leq 15\%$.

As discussed above, the inclined sidewalls of the second semiconducting layer 30 result in a variation in the deposition rate of Group III-nitrides depending on whether the growth surface is an inclined sidewall, or substantially parallel to the substrate. For growth of the p-type semiconducting layer 60, the difference in growth rates also affects the incorporation of Al into the p-type semiconducting layer 60. Accordingly, the inclined sidewall portions 68 may be formed with a higher Al content than the first portion 64 using the same deposition process. As such, the desired potential barrier for confining current in the first portion of the p-type semiconducting layer 64 of the monolithic LED structure may be formed without any further patterning steps.

As described above, a LED precursor may be provided having a plurality of layers.

The first semiconducting layer 20 may have a thickness (in the direction normal to the substrate surface) between 100 nm and 8 μm and preferably between 3 μm and 5 μm. Portions of the first semiconducting layer 20 may be selectively removed to define a mesa structure having a height normal to the bulk semiconducting surface 26 of at least: 100 nm, 200 nm 300 nm or 500 nm. The mesa structure may have a height of no greater than 4 μm. In some embodiments the mesa structure may have a height between 1 μm and 2 μm. A height of the mesa structure may be a distance between the bulk semiconducting surface 26 and the mesa surface 27 in the direction normal to said surfaces.

In some embodiments, the strained sublayer 22 may have a thickness of at least 100 nm. In some embodiments, the strained sublayer 22 may have a thickness which is about equal to the intended height of the mesa structure 24.

The second semiconducting layer 30 may have a thickness of at least 5 nm on the mesa surface 27 of the first semiconducting layer 20. The second semiconducting layer 30 may have a thickness of no greater than 4 µm.

The substantially flat first portion 34 of the active layer 30 may have a thickness between 30 nm and 150 nm and in some embodiments between 40 nm and 60 nm.

The substantially flat first portion of the electron blocking layer 50 may have a thickness between 5 nm and 50 nm and in some embodiments between 20 nm and 40 nm. For example, in the embodiment of FIG. 3, the electron blocking layer may have a thickness of 33 nm. Due to variations in the deposition rate, as discussed above, the thickness of the electron blocking layer 50 in the sidewall regions of the electron blocking layer 50 may have a thickness of at least 0.5 nm up to around 25 nm. For example, in the embodiment of FIG. 3, the electron blocking layer 50 may have a thickness in the sidewall region of about 7 nm.

The substantially flat first portion 64 of the p-type semiconducting layer 60 may have a thickness of at least: 50 nm, 60 nm 70 nm, 80 nm, 90 nm or 100 nm. The substantially flat first portion 64 of the p-type semiconducting layer 60 may have a thickness of no greater than: 300 nm, 250 nm, or 200 nm. For example, in the embodiment of FIG. 3, the substantially flat first portion 64 of the p-type semiconducting layer 60 may have a thickness of about 100 nm.

In accordance with an embodiment of the disclosure, a light emitting diode precursor 1 is provided. An embodiment of a LED precursor 1 according to this disclosure is shown in FIG. 4. The LED precursor of FIG. 4 comprises a first semiconducting layer 20, a second semiconducting layer 30, an active layer 40, an electron blocking layer 50 and a p-type semiconducting layer 60.

As shown in FIG. 4, the first semiconducting layer 20 may be provided on a substrate 10. The substrate 10 may comprise sapphire, silicon or SiC. The substrate 10 may comprise one or more buffer layers configured to provide a substrate surface suitable for the formation of Group III-nitride layers. Of course, in some embodiments, the LED precursor 1 may be fabricated in accordance with the methods described above, after which the substrate 10 may be removed. In some embodiments the LED precursor 1 may be bonded to a backplane electronic substrate (not shown). The backplane electronic substrate may comprise electrical circuitry and contacts configured to control and make contact to the LED precursor 1. In some embodiments, the backplane electronic substrate may be bonded to the p-type semiconducting layer 60.

As shown in FIG. 4, the first semiconducting layer 20 includes a mesa structure 24 extending from a major surface of the first semiconducting layer 20 to define a growth surface 25 including a bulk semiconductor surface 26 and a mesa surface 27. By major surface, it is understood to mean a surface of the first semiconducting layer 20 forming a substantial part of the total surface area of the first semiconducting layer 20. For example, in FIGS. 4, the major surface forming the growth surface 25 is the surface of the first semiconducting layer 20 provided on an opposite side of the first semiconducting layer 20 to the substrate 10.

The mesa structure 24 may be considered to be a column extending from the bulk semiconductor surface 26 of the first semiconducting layer 20. The mesa structure 24 is formed monolithically with the bulk semiconductor surface 26 of the first semiconducting layer 20, for example as described in the methods above. The mesa structure 24 may me a column having any cross-sectional shape (i.e. the shape of the column when viewing the first semiconducting layer 20 in plan view). For example, the mesa structure 24 may be a column having a regular polygon cross section. In particular, the mesa structure 24 may be an elliptical (or circular) column, a rectangular column, or a hexagonal column. FIG. 8a shows one example of a plurality of mesa structures 24 of a first semiconducting layer 20, wherein each mesa structure 24 is a circular column.

The first semiconducting layer 20 comprises a first semiconducting sublayer 21 and a strain relaxed sublayer. The formation and structure of the first semiconducting sublayer 21 and the strain relaxed sublayer is discussed in detail above, and so is not repeated again here.

In the embodiments of FIG. 4, the mesa structure 24 is shown with sidewalls which are substantially perpendicular to the bulk semiconducting surface 26 and the mesa surface 27. In other embodiments, the mesa structure 24 may be formed with inclined sidewalls.

As shown in FIG. 4, a monolithic LED structure is provided on the growth surface 25 of the first semiconducting layer 20 such that the monolithic LED structure covers the mesa surface 27 and the bulk semiconducting surface 26.

As described above, the monolithic LED structure comprises a plurality of layers. Each layer is formed from a Group III-nitride. The monolithic LED structure comprises a second semiconducting layer 30, an active layer 40, and a p-type semiconducting layer 60. In some embodiments, the monolithic LED structure may also comprise an electron blocking layer 50.

As discussed above, the second semiconducting layer 30 is provided on the growth surface 25 to provide inclined sidewalls 38 extending between a first portion of the second semiconducting layer 34 on the mesa surface 27 of the first semiconducting layer and a second portion of the second semiconducting layer 36 on the bulk semiconducting surface 26 of the first semiconducting layer 20. Accordingly, the second semiconducting layer 30 is overgrown on the mesa structure 24 of the first semiconducting layer 20 to provide a Group III-nitride semiconducting layer comprising a first portion 34 and surrounded by inclined sidewalls 33. As such, the second semiconductor layer 30 may be overgrown on the mesa structure 24 to form a column having a regular trapezoidal cross-section normal to the substrate with a surface of the first portion of the second semiconductor layer 35 being substantially flat. The substantially flat surface of the first portion 35 may be in a plane parallel to the substrate surface on which the layers are formed.

The active layer 40, electron blocking layer 50 (if present), and the p-type semiconducting layer 60 may be provided on the second semiconducting layer 30 in accordance with the methods described above to form a monolithic LED structure. Example of such monolithic LED structures may also be seen in at least FIGS. 5, 6, 7, and 9.

In order to improve charge carrier confinement in the active layer over mesa surface 27 of the LED, LED precursors according to this disclosure may comprise a potential barrier between a first portion of the monolithic LED structure covering the mesa surface 27 and a second portion of the monolithic LED structure covering the bulk semiconducting surface 26, wherein the potential barrier surrounds the first portion of the p-type semiconducting layer covering the mesa surface 2. That is to say, methods according to this disclosure provide a potential barrier between the substantially flat surface of the regular trapezoidal shape and the layers formed over the bulk semiconducting surface 26.

As shown in FIGS. 7 and 9, the monolithic LED structure is formed such that a potential barrier is provided between a first portion of the p-type semiconducting layer covering the mesa surface 64 and a second portion of the p-type semiconducting layer covering the bulk semiconducting surface 66, the potential barrier surrounding the first portion of the p-type semiconducting layer 64 covering the mesa surface. The formation of the potential barriers in the embodiments of FIGS. 7 and 9 is discussed in detail above and so is not repeated here.

Accordingly, a LED precursor according to an embodiment of the disclosure may be provided.

According to another embodiment of the disclosure, a method of forming a LED array precursor may be provided.

According to the method, a first semiconducting layer 20 comprising a Group III-nitride is formed on a substrate 10. The first semiconducting layer has a growth surface 25 on an opposite side of the first semiconducting layer 20 to the substrate 10. As such, the first semiconducting layer 20 may be formed in substantially the same method as described above for the embodiments of FIGS. 1-9.

Next, portions of the first semiconducting layer 20 are selectively remove to form a plurality of mesa structures 24 such that the growth surface 25 of the first semiconducting layer 20 comprises a plurality of mesa surfaces 27 and a bulk semiconducting layer surface 26. As such, this step of the method is substantially the same as the corresponding step of the method of forming a LED precursor, wherein a plurality of mesa structures 24 are formed.

Figure 10:
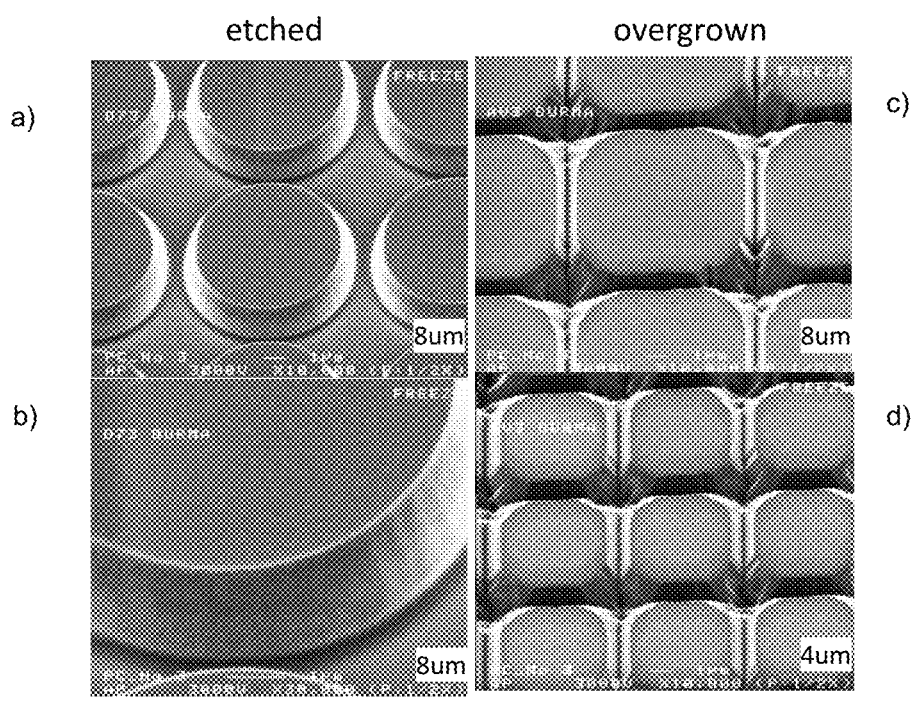
FIGS. 10a and 10b show SEM images of examples of mesa structures arranged in a square packed array.
FIGS. 10c and 10d show SEM images of an overgrown monolithic LED array structure.

The plurality of mesa structures 24 may be regularly spaced apart across the substrate growth surface 25 of the first semiconducting layer 20. For example, the mesa structures may be provided in a hexagonally close-packed array or a square packed array of mesa structures 24. FIG. 10a shows a Scanning Electron Micrograph (SEM) image of an exemplary layer including a plurality of mesa structures similar to a first semiconducting layer 20 according to this disclosure. It will be appreciated from FIG. 10a that a plurality of mesa structures 24 may be provided as part of the first semiconducting layer 20. Each of the mesa structures 24 may be a column with a cylindrical shape (a circular cross section). FIG. 8b shows a magnified view of one of the mesa structures 24 shown in FIG. 10a.

A monolithic LED array structure is then formed on the growth surface 25 of the first semiconducting layer 20 such that first portions of the monolithic LED array structure cover a respective mesa surface 27 and a second portion of the monolithic LED array structure covers the bulk semiconducting surface 26. The monolithic LED array structure comprises a plurality of layers. Each layer is formed from a Group III-nitride. The monolithic array structure may include a second semiconducting layer 30, an active layer 40 provided on the second semiconducting layer 30, and a p-type semiconducting layer 60 provided on the active layer 40. In some embodiments, the monolithic LED array structure may also comprise an electron blocking layer 50 provided between the active layer 40 and the second semiconducting layer 60.

A monolithic LED array structure refers to the provision of a LED array structure formed as a single piece. That is to say, the monolithic LED array structure is formed as a single piece on the first semiconductor layer.

The layers of the monolithic LED array structure may be provided using substantially the same process as described above for the method of forming an LED precursor. It will be appreciated that substantially the same processes for forming a monolithic LED array structure/monolithic LED structure may be used regardless of the number or shape of the LEDs being fabricated. As such, the overgrowth method of this disclosure provides a method of forming of an LED array precursor in which a substantial part of the fabrication process is independent of the geometry of the LED array.

Figure 11:
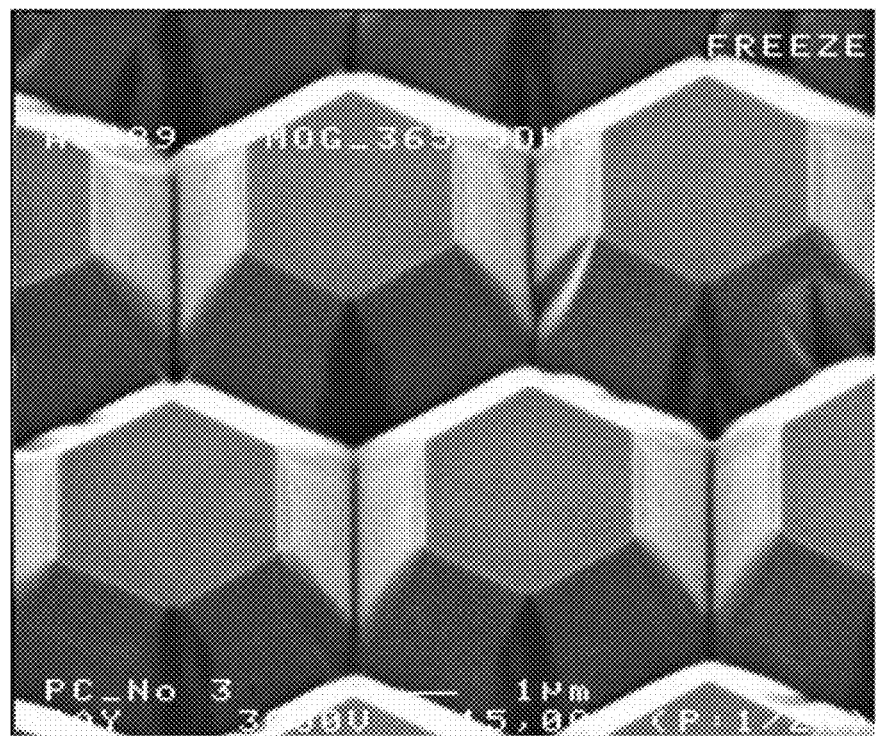
FIG. 11 shows an SEM image of an overgrown monolithic LED array structure arranged in a hexagonal packed array.

FIGS. 10c and 10d show SEM images of a plurality of mesa structures with an overgrown monolithic LED array structure. The monolithic LED array structure has been formed on a plurality of mesa structures similar to those shown in FIG. 10a. In FIGS. 10a-10d, the mesa structures are formed in a square packed array pattern. FIG. 11 shows an SEM image of a further array of mesa structures with an overgrown monolithic LED array structure. In FIG. 11, the mesa structures are arranged in a hexagonally close-packed array pattern in order to provide the array structure shown.

A potential barrier may be provided between each first portion of the p-type semiconducting layer 64 covering each mesa surface 27 and a bulk portion of the p-type semiconducting layer 66 covering the bulk semiconducting surface 26. The potential barrier surrounds each first portion of the p-type semiconducting layer 64 covering the respective mesa surfaces 27.

In order to improve charge carrier confinement in the active layer 40 over each mesa surface 27 of each LED, a potential barrier is formed in each LED between a first portion of the monolithic LED structure covering the mesa surface 27 and a second portion of the monolithic LED structure covering the bulk semiconducting surface 26, wherein the potential barrier surrounds the first portion of the p-type semiconducting layer covering the mesa surface 27. That is to say, methods according to this disclosure provide a potential barrier between upper contact surfaces of the substantially flat surfaces of the regular trapezoidal shape and the layers formed over the bulk semiconducting surface 26.

The potential barrier for each monolithic LED structure of the LED array may be formed in a number of ways. For example, the potential barrier for each monolithic LED structure may be formed substantially as described in above with reference to FIG. 7 or substantially as described above with reference to FIG. 9.

Similar to the structure shown in FIG. 7, the potential barriers may be formed by selectively removing a portion third of the p-type semiconducting layer 61 encircling each first portion of the p-type semiconducting layer covering the mesa surface 64. As shown in FIG. 7, the p-type semiconducting layer 60 is selectively removed through thickness of the layer to expose the layer below (the electron blocking layer 50 in the structure of FIG. 7).

Similar to the structure in FIG. 9, the potential barrier may also be formed by providing the p-type semiconducting layer 60 comprising a group III-nitride including Al. The p-type semiconducting layer 60 is provided such that a higher concentration of Al is incorporated into sidewall portions of the p-type semiconducting layer 63 than a first portion of the p-type semiconducting layer 64 covering the mesa surface 27 such that a potential barrier is provided between the sidewall portion of the p-type semiconducting layer 63 and the first portion of the p-type semiconducting layer 64. The difference in Al composition between the sidewall portion 63 and the first portion of the p-type semiconducting layer 64 may be such that the change in bandgap is larger than kT eV at room temperature (i.e. greater than about 0.26 eV).

Accordingly, a method of forming an LED array precursor is provided

In a further embodiment of the disclosure, a LED array precursor is provided.

The LED array precursor comprises a first semiconducting layer 20 and a monolithic LED array structure.

The first semiconducting layer 20 comprises a Group III-nitride. As shown in FIG. 4, the first semiconducting layer 20 may be provided on a substrate 10. The substrate 10 may comprise sapphire, silicon or SiC. The substrate 10 may comprise one or more buffer layers configured to provide a substrate surface suitable for the formation of Group III-nitride layers. Of course, in some embodiments, the LED array precursor may be fabricated in accordance with the methods described above, after which the substrate 10 may be removed. In some embodiments the LED array precursor may be bonded to a backplane electronic substrate. The backplane electronic substrate may comprise electrical circuitry and contacts configured to control and make contact to the LEDs of the LED array precursor. In some embodiments, the backplane electronic substrate may be bonded to the p-type semiconducting layer 60. As such, the first semiconducting layer 20 may be provided substantially in accordance with the methods outlined above.

Similar to the embodiments shown in FIGS. 4, 5, 7 and 9, the first semiconducting layer 20 includes a plurality of mesa structures 24 extending from a major surface of the first semiconducting layer to define a growth surface 25 including a bulk semiconductor surface 26 and a mesa surface 27. As discussed above, an example of a first semiconducting layer comprises a plurality of mesa structures 24 is shown in FIG. 8a Similar to the embodiments shown in FIGS. 4, 5, 7 and 9, a monolithic LED array structure is provided on the growth surface 25 of the first semiconducting layer 20 such that the monolithic LED array structure covers the mesa surfaces 27 and the bulk semiconducting surface 26.

As described above, the monolithic LED array structure comprises a plurality of layers. Each layer is formed from a Group III-nitride. The monolithic LED array structure may comprise a second semiconducting layer 30, an active layer 40, an electron blocking layer 50 and a p-type semiconducting layer 60. Each of the layers of the monolithic LED array structure may be formed as a continuous layer. As such, each of the layers of the monolithic LED array structure may be provided in a similar manner to the monolithic LED structure discussed above.

In order to improve charge carrier confinement in the active layer over each mesa surface 27 of the LED array precursor, each LED precursors of the array comprises a potential barrier between a first portion of each monolithic LED structure covering a respective mesa surface 27 and a second portion of each monolithic LED structure covering the bulk semiconducting surface 26, wherein the potential barrier surrounds the first portion of each p-type semiconducting layer covering the respective mesa surface 27. That is to say, methods according to this disclosure provide a potential barrier between each substantially flat surface of the regular trapezoidal shapes and the layers formed over the bulk semiconducting surface 26.

With reference to FIGS. 7 and 9, each monolithic LED array structure is formed such that a potential barrier is provided between first portions of the p-type semiconducting layers covering the mesa surfaces 64 and a second portion of the p-type semiconducting layer covering the bulk semiconducting surface 66, the potential barrier surrounding the first portions of the p-type semiconducting layer covering the mesa surfaces 65.

With reference to FIG. 7 and the above description, the potential barriers may be formed by selectively removing third portions of the p-type semiconducting layer 61 encircling the first portions of the p-type semiconducting layer covering the mesa surfaces 67. As shown in FIG. 5, the p-type semiconducting layer 60 may be selectively removed through thickness of the layer to expose the layer below (the electron blocking layer 50 in the embodiment of FIG. 5).

With reference to FIG. 9, the potential barrier may be formed by providing the p-type semiconducting layer 60 comprising a group III-nitride including Al. The p-type semiconducting layer 60 is provided such that a higher concentration of Al is incorporated into sidewall portions 63 of the p-type semiconducting layer 60 than the first portions of the p-type semiconducting layer 64 covering the mesa surfaces 27 such that potential barriers are provided between the sidewall portions of the p-type semiconducting layer 63 and the first portions of the p-type semiconducting layer 67 for each LED precursor in the LED array precursor. The difference in Al composition between the sidewall portions 68 and the first portions 64 of the p-type semiconducting layer may be such that the change in bandgap is larger than kT eV at room temperature (i.e. greater than about 0.26 eV).

For example, the sidewall portions of p-type semiconducting layer 68 may comprise p-type $Al_xGa_{1-x}N$, wherein $2 \leq x \leq 50\%$, and the mesa surface portion of the p-type semiconducting layer 65 may comprise p-type $Al_yGa_{1-y}N$, wherein $1 \leq y \leq 15\%$.

As discussed above, the inclined sidewalls of the second semiconducting layer 30 result in a variation in the deposition rate of Group III-nitrides depending on whether the growth surface is an inclined sidewall, or substantially parallel to the substrate. For growth of the p-type semiconducting layer 60, the difference in growth rates also affects the incorporation of Al into the p-type semiconducting layer 60. Accordingly, the inclined sidewall portions 68 may be formed with a higher Al content than the first portions of the p-type semiconducting layer 64 using the same deposition process. As such, the desired potential barrier for confining current in the mesa surface portion of the monolithic LED structure may be formed without any further patterning steps.

The invention claimed is:

1. A method of forming a Light Emitting Diode (LED) precursor comprising:
    (a) forming a first semiconducting layer on a substrate, forming the first semiconducting layer comprising:
    forming a first semiconducting sublayer comprising a Group III-nitride having a first in-plane lattice constant on a surface of the substrate; and
    forming a strained sublayer comprising a Group III-nitride on the first semiconducting sublayer on an opposite side of the first semiconducting sublayer to the substrate, wherein the strained sublayer at the interface between the strained sublayer and the first semiconducting sublayer is under compressive strain such that an in-plane lattice constant of the strained sublayer at the interface is the first in-plane lattice constant;
    (b) selectively removing a portion of the first semiconducting layer to expose a bulk semiconducting layer surface of the first semiconducting layer such that the first semiconductor layer defines a mesa structure extending from the bulk semiconducting layer surface;
    (c) heating the strained sublayer to a strain relaxing temperature, wherein the strained sublayer relaxes through plastic deformation to form a strain relaxed sublayer, wherein the mesa structure has a mesa surface formed from a portion of the strain relaxed sublayer having a second in-plane lattice constant which is larger than the first in-plane lattice constant;
    (d) forming a monolithic LED structure on the first semiconducting layer such that the monolithic LED structure covers the mesa surface and the bulk semiconducting layer surface, the monolithic LED structure comprising a plurality of Group III-nitride layers, the monolithic LED structure having:
 a first monolithic LED structure portion provided over the mesa surface; and
 a second monolithic LED structure portion encircling the first monolithic LED structure portion and having an inclined sidewall surface relative to the mesa surface.

2. A method according to claim 1, wherein selectively removing a portion of the first semiconducting layer includes removing a portion of the strained sublayer through a thickness of the strained sublayer and a corresponding portion of the first semiconducting sublayer, such that the bulk semiconducting layer surface is formed in the first semiconducting sublayer.

3. A method according to claim 1, wherein the strained sublayer comprises $In_XGa_{1-X}N$, where $0<X\leq1$.

4. A method according to claim 3, wherein the strained sublayer comprises a plurality of layers, alternating between a first strain layer comprising GaN and a second strain layer comprising $In_XGa_{1-X}N$, where $0<X\leq1$.

5. A method according to claim 3, wherein In content (X) of the strained sublayer decreases in the thickness direction away from the first semiconducting sublayer.

6. A method according to claim 1, wherein the monolithic LED structure comprises:
 a second semiconducting layer provided over the mesa surface and the bulk semiconducting layer surface of the first semiconducting layer;
 an active layer comprising a plurality of Group III nitride layers provided on the second semiconducting layer;
 a p-type semiconducting layer comprising a Group III nitride formed on the active layer.

7. A method according to claim 6, wherein the second semiconducting layer comprises GaN, or $In_YGa_{1-Y}N$, where $0<Y\leq1$.

8. A method according to claim 6, wherein the active layer is configured to output light having a wavelength of at least 500 nm.

9. A method according to claim 6, wherein the active layer comprises at least one quantum well layer comprising $In_ZGa_{1-Z}N$ having a third in-plane lattice constant which is at least equal to the second in-plane lattice constant, where $0<Z\leq1$.

10. A method according to claim 6, wherein
 a potential barrier is provided between a first portion of the p-type semiconducting layer covering the mesa surface and a second portion of the p-type semiconducting layer covering the bulk semiconducting layer surface, the potential barrier surrounding the first portion of the p-type semiconducting layer covering the mesa surface.

11. A method according to claim 1, wherein the strain relaxing temperature is at least 800° C.

12. A Light Emitting Diode (LED) precursor comprising:
 a first semiconducting layer comprising Group III-nitrides, the first semiconducting layer including a mesa structure extending from a major surface of the first semiconducting layer to define a growth surface including a bulk semiconducting surface and a mesa surface, wherein the first semiconducting layer comprises:
  a first semiconducting sublayer comprising a Group III-nitride having a first in-plane lattice constant; and
  a strain relaxed sublayer comprising a Group III-nitride provided across the first semiconducting sublayer, wherein the strain relaxed sublayer provides the mesa surface of the mesa structure, the mesa surface having a second in-plane lattice constant which is larger than the first in-plane lattice constant; and
 a monolithic LED structure provided on the growth surface of the first semiconducting layer such that the monolithic LED structure covers the mesa surface and the bulk semiconducting surface, the monolithic LED structure comprising a plurality of Group III-nitride layers, the monolithic LED structure having:
  a first monolithic LED structure portion provided over the mesa surface; and
  a second monolithic LED structure portion encircling the first monolithic LED structure portion and having an inclined sidewall surface relative to the mesa surface.

13. A LED precursor according to claim 12, wherein the LED precursor is provided as part of an LED array precursor, wherein:
 the first semiconducting layer includes a plurality of mesa structures, each mesa structure extending from a major surface of the first semiconducting layer to define a growth surface including a bulk semiconducting surface and a plurality of mesa surfaces,
 wherein the strain relaxed sublayer provides the mesa surface of each mesa structure, the mesa surface having a second in-plane lattice constant which is larger than the first in-plane lattice constant;
 wherein the monolithic LED structure provided on the growth surface of the first semiconducting layer covers each mesa surface and the bulk semiconducting surface, the monolithic LED structure comprising a plurality of Group III-nitride layers, the monolithic LED structure having:
 a plurality of first monolithic LED structure portions, each first monolithic LED structure portion provided over a respective mesa surface; and
 a plurality of second monolithic LED structure portions, each second monolithic LED structure portion encircling a respective first monolithic LED structure portion and having an inclined sidewall surface relative to the respective mesa surface.

14. A method of forming a LED array precursor comprising:
 (a) forming a first semiconducting layer on a substrate, forming the first semiconducting layer comprising:
  forming a first semiconducting sublayer comprising a Group III-nitride having a first in-plane lattice constant on a surface of the substrate; and
  forming a strained sublayer comprising a Group III-nitride on the first semiconducting sublayer on an opposite side of the first semiconducting sublayer to the substrate, wherein the strained sublayer at the interface between the strained sublayer and the first semiconducting sublayer is under compressive strain such that an in-plane lattice constant of the strained sublayer at the interface is the first in-plane lattice constant;
 (b) selectively removing a portion of the first semiconducting layer to expose a bulk semiconducting layer surface of the first semiconducting layer such that the first semiconductor layer defines a plurality of mesa structures each extending from the bulk semiconducting layer surface,
 (c) heating the strained sublayer to a strain relaxing temperature, wherein the strained sublayer relaxes through plastic deformation to form a strain relaxed sublayer wherein each mesa structure has a mesa surface formed from a portion of the strain relaxed sublayer having a second in-plane lattice constant which is larger than the first in-plane lattice constant;

(d) forming a monolithic LED structure on the first semiconducting layer such that the monolithic LED structure covers the mesa surfaces and the bulk semiconducting layer surface, the monolithic LED structure comprising a plurality of Group III-nitride layers, the monolithic LED structure having:

a plurality of first monolithic LED structure portions, each first monolithic LED structure portion provided over a respective mesa surface; and a plurality of second monolithic LED structure portions, each second monolithic LED structure portion encircling a respective first monolithic LED structure portion and having an inclined sidewall surface relative to the respective mesa surface.

* * * * *